United States Patent
Yamazaki et al.

(10) Patent No.: US 8,643,008 B2
(45) Date of Patent: Feb. 4, 2014

(54) SEMICONDUCTOR DEVICE

(75) Inventors: Shunpei Yamazaki, Setagaya (JP); Naoto Yamade, Isehara (JP); Junichi Koezuka, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/547,119

(22) Filed: Jul. 12, 2012

(65) Prior Publication Data

US 2013/0020569 A1    Jan. 24, 2013

(30) Foreign Application Priority Data

Jul. 22, 2011    (JP) ................. 2011-161222

(51) Int. Cl.
    *H01L 29/10*  (2006.01)
    *H01L 29/18*  (2006.01)
    *H01L 27/148* (2006.01)

(52) U.S. Cl.
    USPC ............... 257/43; 257/88; 257/223; 257/225

(58) Field of Classification Search
    USPC ..................... 257/43, 223, 225, 88
    See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Machine translation Japan application No. JP2007-123861 on May 10, 2013.*

(Continued)

*Primary Examiner* — Long K Tran
*Assistant Examiner* — Dzung Tran
(74) *Attorney, Agent, or Firm* — Eric J. Robinson; Robinson Intellectual Property Law Office, P.C.

(57) ABSTRACT

A semiconductor device which can operate at high speed and consumes a smaller amount of power is provided. In a semiconductor device including transistors each including an oxide semiconductor, the oxygen concentration of the oxide semiconductor film of the transistor having small current at negative gate voltage is different from that of the oxide semiconductor film of the transistor having high field-effect mobility and large on-state current. Typically, the oxygen concentration of the oxide semiconductor film of the transistor having high field-effect mobility and large on-state current is lower than that of the oxide semiconductor film of the transistor having small current at negative gate voltage.

14 Claims, 23 Drawing Sheets

(56) References Cited

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0201450 A1* | 10/2003 | Yamazaki et al. .............. 257/88 |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1* | 1/2005 | Hoffman ....................... 257/347 |
| 2005/0040393 A1* | 2/2005 | Hong ............................ 257/40 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0018075 A1* | 1/2007 | Cazaux et al. ............. 250/208.1 |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1* | 8/2007 | Hosono et al. ................ 257/347 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0158138 A1* | 7/2008 | Yamazaki et al. ............ 345/102 |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0140609 A1* | 6/2010 | Yano et al. ....................... 257/43 |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0136301 A1 | 6/2011 | Yamazaki et al. |
| 2011/0136302 A1 | 6/2011 | Yamazaki et al. |
| 2011/0163311 A1 | 7/2011 | Akimoto et al. |
| 2011/0204362 A1 | 8/2011 | Akimoto et al. |
| 2011/0212569 A1 | 9/2011 | Yamazaki et al. |
| 2011/0212570 A1 | 9/2011 | Yamazaki et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0269266 A1 | 11/2011 | Yamazaki |
| 2012/0112184 A1 | 5/2012 | Yamazaki et al. |
| 2012/0146019 A1 | 6/2012 | Yamazaki et al. |
| 2012/0149147 A1 | 6/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2009-224479 | 10/2009 |
| WO | WO-2004/114391 | 12/2004 |

OTHER PUBLICATIONS

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

(56) References Cited

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 25, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350 °C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO ($Ga_2O_3$-$In_2O_3$-ZnO) TFT,", SID Digest '08 : SID Internatinoal Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID DIgest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM '09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics..

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2009, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3-A2O3-BO Systems [A; FE, GA, OR AL; B: MG, MN, FE, NI, CU, OR ZN] at Temperatures Over 1000 °C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE

BACKGROUND OF THE INVENTION

1. Field of the Invention

The present invention relates to a semiconductor device which includes a circuit including a semiconductor element such as a transistor, and a method for manufacturing the semiconductor device. For example, the present invention relates to a power device which is mounted on a power supply circuit; a semiconductor integrated circuit including a memory, a thyristor, a converter, an image sensor, or the like; an electro-optical device typified by a liquid crystal display panel; a light-emitting display device including a light-emitting element; and an electronic device including any of the above as a component.

In this specification, a semiconductor device means all types of devices which can function by utilizing semiconductor characteristics, and an electro-optical device, a light-emitting display device, a semiconductor circuit, and an electronic device are all semiconductor devices.

2. Description of the Related Art

Transistors formed over a glass substrate or the like are typically manufactured using amorphous silicon, polycrystalline silicon, or the like, as typically seen in liquid crystal display devices. Although transistors including amorphous silicon have low field effect mobility, they can be formed over a larger glass substrate. On the other hand, although transistors including polycrystalline silicon have high field effect mobility, they are not suitable for being formed over a larger glass substrate.

In view of the foregoing, attention has been drawn to a technique by which a transistor is manufactured using an oxide semiconductor and such a transistor is applied to an electronic device or an optical device. For example, Patent Document 1 and Patent Document 2 disclose a technique by which a transistor is manufactured using an oxide semiconductor such as zinc oxide or an In—Ga—Zn—O-based oxide as an oxide semiconductor and is used as a switching element of a pixel or the like of a display device.

Meanwhile, it has been pointed out that hydrogen is a source for supplying carriers particularly in an oxide semiconductor. Therefore, some measures need to be taken to prevent hydrogen from entering the oxide semiconductor at the time of depositing the oxide semiconductor. Further, variation of a threshold voltage is suppressed by reducing the amount of hydrogen contained in not only the oxide semiconductor but also a gate insulating film in contact with the oxide semiconductor (see Patent Document 3).

REFERENCE

Patent Document

[Patent Document 1] Japanese Published Patent Application No. 2007-123861

[Patent Document 2] Japanese Published Patent Application No. 2007-96055

[Patent Document 3] Japanese Published Patent Application No. 2009-224479

SUMMARY OF THE INVENTION

It is difficult to manufacture a transistor including an oxide semiconductor which has all characteristics of small current at negative gate voltage, high field-effect mobility, and large on-state current. A semiconductor device including a transistor having high field-effect mobility and large on-state current consumes a large amount of power due to the current of the transistor at negative gate voltage. In contrast, it is difficult for a semiconductor device including a transistor having small current at negative gate voltage to operate at high speed because the transistor has low field-effect mobility and small on-state current.

Thus, an object of an embodiment of the present invention is to provide a semiconductor device which can operate at high speed and consumes a smaller amount of power.

In an embodiment of the present invention, in a semiconductor device including transistors each including an oxide semiconductor, a transistor having small current at negative gate voltage and a transistor having high field-effect mobility and large on-state current are separately formed. Typically, the semiconductor device includes a circuit including the transistor having small current at negative gate voltage and a circuit including the transistor having high field-effect mobility and large on-state current. The transistor having high field-effect mobility and large on-state current and the transistor having small current at negative gate voltage each include an oxide semiconductor film, a gate electrode overlapping with the oxide semiconductor film, and a gate insulating film between the oxide semiconductor film and the gate electrode. Further, the oxide semiconductor film includes a first region overlapping with the gate electrode. The oxygen concentration of the first region of the oxide semiconductor film of the transistor having small current at negative gate voltage is different from that of the first region of the oxide semiconductor film of the transistor having high field-effect mobility and large on-state current. The oxygen concentration of the first region of the oxide semiconductor film of the transistor having high field-effect mobility and large on-state current is preferably lower than that of the first region of the oxide semiconductor film of the transistor having small current at negative gate voltage.

Note that oxygen is added to the oxide semiconductor film of the transistor having small current at negative gate voltage. The concentration of oxygen added to the oxide semiconductor film is higher than or equal to $5 \times 10^{19}/cm^3$ and lower than or equal to $5 \times 10^{21}/cm^3$.

Further, the oxide semiconductor films of the transistor having high field-effect mobility and large on-state current and the transistor having small current at negative gate voltage each include the first region overlapping with the gate electrode and a pair of second regions between which the first region is sandwiched. Alternatively, the oxide semiconductor films of the transistor having high field-effect mobility and large on-state current and the transistor having small current at negative gate voltage each include the first region overlapping with the gate electrode, a pair of second regions between which the first region is sandwiched, and a pair of third regions between which the pair of second regions is sandwiched.

The pair of second regions and the pair of third regions contain dopant. The dopant concentration of the pair of second regions and the dopant concentration of the pair of third regions are each higher than or equal to $5 \times 10^{18}$ atoms/$cm^3$ and lower than or equal to $1 \times 10^{22}$ atoms/$cm^3$, preferably higher than or equal to $5 \times 10^{18}$ atoms/$cm^3$ and lower than $5 \times 10^{19}$ atoms/$cm^3$.

The transistor having high field-effect mobility and large on-state current and the transistor having small current at negative gate voltage may each have a single gate structure. Alternatively, the transistor having small current at negative gate voltage may have a single gate structure and the transistor having high field-effect mobility and large on-state current may have a dual gate structure. The threshold voltage of a transistor having a dual gate structure can be controlled by application of different voltages to two electrodes.

The transistor having high field-effect mobility and large on-state current and the transistor having small current at negative gate voltage each include a pair of electrodes in contact with the oxide semiconductor film. Further, the transistor having high field-effect mobility and large on-state current and the transistor having small current at negative gate voltage may each be a staggered transistor or a coplanar transistor.

The oxide semiconductor films each contain one or more of elements selected from In, Ga, Sn, and Zn.

The transistors including oxide semiconductor films having different oxygen concentrations of the first regions overlapping with respective gate electrodes are manufactured. The transistor having higher oxygen concentration of the first region, i.e., the transistor including an oxide semiconductor film containing oxygen in a higher proportion than a proportion of oxygen in the stoichiometric ratio, includes a smaller number of oxygen defects in the oxide semiconductor film. Therefore, the donor level due to oxygen defects in the energy gap is low or does not substantially exist. As a result, leakage current is not easily generated in an off state, achieving a reduction in current at negative gate voltage of the transistor. On the other hand, since the transistor having lower oxygen concentration of the first region, i.e., the transistor including an oxide semiconductor film containing oxygen in a lower proportion than a proportion of oxygen in the stoichiometric ratio, includes oxygen defects, carriers are easily generated in an on state, resulting in an increase in field-effect mobility and on-state current of the transistor. Therefore, a semiconductor device which can operate at high speed and consume a smaller amount of power can be manufactured by formation of transistors in accordance with characteristics of circuits included in the semiconductor device. Specifically, a transistor having high field-effect mobility and large on-state current is used in a circuit which needs to operate at high speed and a transistor having small current at negative gate voltage is used in a circuit with small leakage current.

According to an embodiment of the present invention, a transistor including a large number of oxygen defects in an oxide semiconductor film and a transistor including a small number of oxygen defects in an oxide semiconductor film can be manufactured. As a result, a transistor having high field-effect mobility and large on-state current and a transistor having small current at negative gate voltage can be manufactured. Further, these transistors are separately formed in circuits in accordance with functions thereof, whereby a semiconductor device can operate at high speed and consume a smaller amount of power.

DETAILED DESCRIPTION OF THE INVENTION

Figure 1:
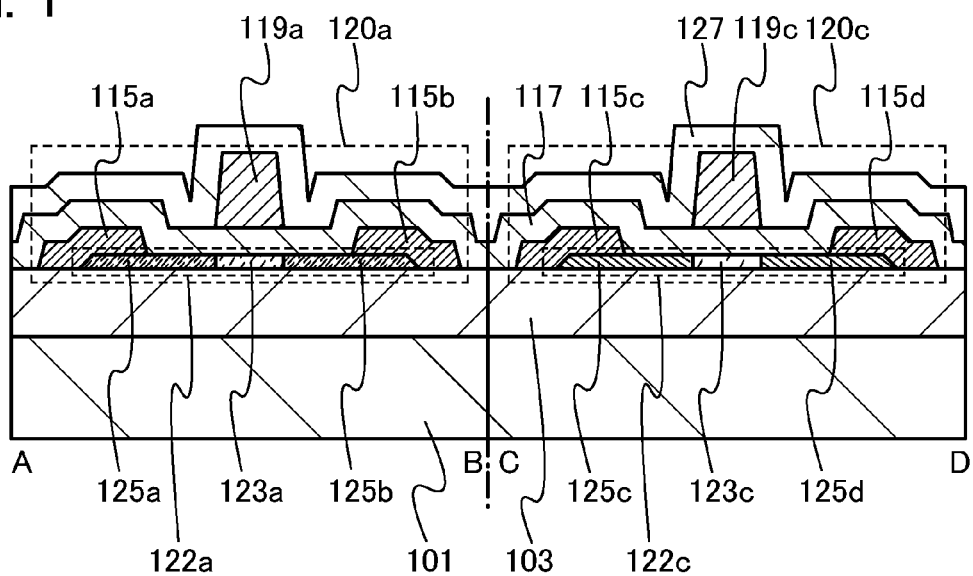
FIG. 1 is a cross-sectional view illustrating a semiconductor device according to an embodiment of the present invention.

Embodiments of the present invention will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that the same portions or portions having the same function in the structure of the present invention described below are denoted by the same reference numerals in common among different drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

(Embodiment 1)

In this embodiment, a structure of a semiconductor device including a transistor having small current at negative gate voltage and a transistor having high field-effect mobility and large on-state current, and a method for manufacturing the semiconductor device will be described with reference to FIG. 1, FIGS. 2A to 2D, and FIGS. 3A to 3C. The transistors of this embodiment are each a coplanar transistor having a top gate structure and are each characterized in that a pair of electrodes covers side surfaces and part of a top surface of an oxide semiconductor film.

FIG. 1 is a cross-sectional view of the semiconductor device described in this embodiment. The semiconductor device illustrated in FIG. 1 includes a transistor 120a having small current at negative gate voltage and a transistor 120c having high field-effect mobility and large on-state current.

The transistor 120a having small current at negative gate voltage includes an insulating film 103 over a substrate 101, an oxide semiconductor film 122a over the insulating film 103, a pair of electrodes 115a and 115b which is in contact with the oxide semiconductor film 122a and serves as a source electrode and a drain electrode, a gate insulating film 117 covering the oxide semiconductor film 122a, and a gate electrode 119a which is provided over the gate insulating film 117 and overlaps with the oxide semiconductor film 122a. The oxide semiconductor film 122a includes a first region 123a overlapping with the gate electrode 119a and a pair of second regions 125a and 125b between which the first region 123a is sandwiched and which contains dopant. In the oxide semiconductor film 122a, the first region 123a serves as a channel region, and regions of the pair of second regions 125a and 125b containing dopant, which are in contact with the pair of electrodes 115a and 115b, serve as a source region and a drain region. With regions which are not in contact with the pair of electrodes 115a and 115b in the pair of second regions 125a and 125b, source-drain breakdown voltage can be increased.

The transistor 120c having high field-effect mobility and large on-state current includes the insulating film 103 over the substrate 101, an oxide semiconductor film 122c over the insulating film 103, a pair of electrodes 115c and 115d which is in contact with the oxide semiconductor film 122c and serves as a source electrode and a drain electrode, the gate insulating film 117 covering the oxide semiconductor film 122c, and a gate electrode 119c which is provided over the gate insulating film 117 and overlaps with the oxide semiconductor film 122c. The oxide semiconductor film 122c includes a first region 123c overlapping with the gate electrode 119c and a pair of second regions 125c and 125d between which the first region 123c is sandwiched and which contains dopant. In the oxide semiconductor film 122c, the first region 123c serves as a channel region, and regions of the pair of second regions 125c and 125d containing dopant, which are in contact with the pair of electrodes 115c and 115d, serve as a source region and a drain region. With regions which are not in contact with the pair of electrodes 115c and 115d in the pair of second regions 125c and 125d, source-drain breakdown voltage can be increased.

It is preferable that an insulating film 127 covering the transistors 120a and 120c be formed.

In this embodiment, the oxide semiconductor film 122a included in the transistor 120a contains oxygen in excess of the stoichiometric ratio. In this case, excess oxygen exists between lattices of the oxide semiconductor in some cases. The concentration of oxygen added to the oxide semiconductor film 122a is higher than or equal to $5\times10^{19}/cm^3$ and lower than or equal to $5\times10^{21}/cm^3$.

The oxide semiconductor film 122a includes a smaller number of oxygen defects than the oxide semiconductor film 122c. Therefore, the donor level due to the oxygen defects in the energy gap is low or does not substantially exist. As a result, current at negative gate voltage of the transistor 120a is small. On the other hand, the oxide semiconductor film 122c includes oxygen defects. Therefore, carriers are easily generated in the transistor 120c in an on state. Thus, the transistor 120c has high field-effect mobility and large on-state current.

There is no particular limitation on a material and the like of the substrate 101 as long as the material has heat resistance enough to withstand at least heat treatment to be performed later. For example, a glass substrate, a ceramic substrate, a quartz substrate, or a sapphire substrate may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 101. Furthermore, any of these substrates further provided with a semiconductor element may be used as the substrate 101.

A flexible substrate may also be used as the substrate 101. A separation layer may be provided between the substrate 101 and the insulating film 103. The separation layer can be used when part or the whole of a semiconductor device formed over the separation layer is separated from the substrate 101 and transferred onto another substrate. In such a case, the semiconductor device can be transferred to a substrate having low heat resistance or a flexible substrate as well.

Silicon nitride, silicon nitride oxide, aluminum nitride, aluminum nitride oxide, silicon oxide, silicon oxynitride, gallium oxide, hafnium oxide, yttrium oxide, or the like can be used for the insulating film 103 as appropriate.

Alternatively, the insulating film 103 may be formed using an oxide insulating film from which part of oxygen is released by heating. The oxide insulating film from which part of oxygen is released by heating is preferably an oxide insulating film which contains oxygen at a proportion exceeding the stoichiometric ratio. Oxygen can be diffused from the oxide insulating film from which part of oxygen is released by heating into the oxide semiconductor film by heating, because oxygen is released from the oxide insulating film by heating. Typical examples of the oxide insulating film from which part of oxygen is released by heating include films of silicon oxide, silicon oxynitride, silicon nitride oxide, gallium oxide, hafnium oxide, yttrium oxide, and the like.

The thickness of the insulating film 103 is greater than or equal to 50 nm, preferably greater than or equal to 200 nm and less than or equal to 500 nm. With the use of the thick insulating film 103, in the case where an oxide insulating film from which part of oxygen is released by heating is used as the insulating film, the amount of oxygen released from the insulating film 103 can be increased and interface states at the interface between the insulating film 103 and an oxide semiconductor film to be formed later can be reduced.

Here, "to release part of oxygen by heating" means that the amount of released oxygen is greater than or equal to $1.0 \times 10^{18}$ atoms/cm$^3$, preferably greater than or equal to $3.0 \times 10^{20}$ atoms/cm$^3$ in thermal desorption spectroscopy (TDS) on an oxygen atom basis.

Here, a method for measuring the amount of released oxygen on an oxygen atom basis using TDS analysis will be described.

The amount of released gas in TDS analysis is proportional to the integral value of a spectrum. Therefore, the amount of released gas can be calculated from the ratio of the integral value of a spectrum of the insulating film to the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be calculated according to Formula 1 using the TDS analysis results of a silicon wafer containing hydrogen at a predetermined density, which is the standard sample, and the TDS analysis results of the insulating film. Here, all spectra having a mass number of 32 which are obtained by the TDS analysis are assumed to originate from an oxygen molecule. CH$_3$OH can be given as a compound having a mass number of 32, but is not taken into consideration on the assumption that it is unlikely to be present. Further, an oxygen molecule including an oxygen atom having a mass number of 17 or 18, which is an isotope of an oxygen atom, is also not taken into consideration because the proportion of such a molecule in the natural world is minimal.

$$N_{O2} = \frac{N_{H2}}{S_{H2}} \times S_{O2} \times \alpha \qquad \text{[Formula 1]}$$

$N_{H2}$ is the value obtained by conversion of the number of hydrogen molecules released from the standard sample into density. $S_{H2}$ is an integral value of a spectrum of the standard sample which is analyzed by TDS. Here, the reference value of the standard sample is set to $N_{H2}/S_{H2}$. $S_{O2}$ is an integral value of a spectrum when the insulating film is analyzed by TDS. $\alpha$ is a coefficient affecting the intensity of the spectrum in the TDS analysis. For details of Formula 1, Japanese Published Patent Application No. H6-275697 is referred to. Note that the amount of released oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, part of oxygen is detected as an oxygen atom. The ratio between oxygen molecules and oxygen atoms can be calculated from the ionization rate of oxygen molecules. Note that, since the above α includes the ionization rate of oxygen molecules, the number of the released oxygen atoms can also be estimated through the evaluation of the number of the released oxygen molecules.

Note that $N_{O2}$ is the number of released oxygen molecules. The amount of released oxygen on an oxygen atom basis is twice the number of the released oxygen molecules.

In the above structure, the insulating film from which oxygen is released by heating may be oxygen-excess silicon oxide (SiO$_X$(X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

Oxygen is supplied from the insulating film 103 to the oxide semiconductor films 122a and 122c, whereby the interface states at the interface between the insulating film 103 and the oxide semiconductor film 122a and the interface between the insulating film 103 and the oxide semiconductor film 122c can be reduced. As a result, capture of electric charge or the like which might be generated due to operation of a transistor or the like at the interface between the insulating film 103 and the oxide semiconductor film 122a and the interface between the insulating film 103 and the oxide semiconductor film 122c can be suppressed. Thus, a transistor with less electrical characteristic deterioration can be obtained.

Further, in some cases, electric charge is generated due to oxygen defects in the oxide semiconductor films 122a and 122c. In general, some of oxygen defects in an oxide semiconductor film serve as a donor to generate electrons which are carriers. As a result, the threshold voltage of a transistor shifts in the negative direction. This tendency occurs remarkably in an oxygen defect caused on the back channel side. Note that a back channel in this specification refers to the vicinity of the interface with the insulating film 103 of the first regions 123a and 123c in the oxide semiconductor films 122a and 122c in FIG. 1. Oxygen is sufficiently supplied from the insulating film 103 to the oxide semiconductor films 122a and 122c, whereby oxygen defects in the oxide semiconductor films 122a and 122c, which cause the shift of the threshold voltage in the negative direction, can be reduced.

The oxide semiconductor films 122a and 122c preferably contains at least indium (In) or zinc (Zn). In particular, In and Zn are preferably contained. In addition, as a stabilizer for reducing the variation in electric characteristics of a transistor using the oxide, gallium (Ga) is preferably additionally contained. Tin (Sn) is preferably contained as a stabilizer. Hafnium (Hf) is preferably contained as a stabilizer. Zirconium (Zr) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that, for example, an In—Ga—Zn-based oxide means an oxide containing In, Ga, and Zn, and there is no limitation on the ratio of In:Ga:Zn. The In—Ga—Zn-based oxide may contain a metal element other than In, Ga, and Zn.

Alternatively, a material represented by $InMO_3(ZnO)_m$ (m>0 is satisfied, and m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics and electrical characteristics (e.g., mobility, threshold voltage, and variation). In order to obtain the needed semiconductor characteristics, it is preferable that the carrier density, the impurity concentration, the defect density, the atomic ratio of a metal element to oxygen, the interatomic distance, the density, and the like be set to appropriate values.

Note that the energy gap of a metal oxide which can form each of the oxide semiconductor films 122a and 122c is 2 eV or more, preferably 2.5 eV or more, further preferably 3 eV or more. In this manner, the current which flows when a transistor is in an off state (off-state current) can be reduced by using an oxide semiconductor having a wide energy gap.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a planar surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, further preferably less than or equal to 0.1 nm.

Note that Ra is obtained by expanding arithmetic mean surface roughness, which is defined by JIS B0601: 2001 (ISO4287: 1997), into three dimensions so as to be applicable to a curved surface. In addition, Ra can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \quad \text{[Formula 2]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the average height of the specific surface. Ra can be measured using an atomic force microscope (AFM).

As each of the oxide semiconductor films 122a and 122c, a c-axis aligned crystalline oxide semiconductor (CAAC) film including crystallized parts may be used.

The CAAC film means an oxide semiconductor film including crystals which have c-axis alignment and a triangular or hexagonal atomic arrangement when seen from the direction perpendicular to an a-b plane, a surface, or an interface. In the crystals, metal atoms are arranged in a layered manner, or metal atoms and oxygen atoms are arranged in a layered manner when seen from the direction perpendicular to the c-axis, and the directions of the a-axes or the b-axes are varied in the a-b plane (or the surface, or at the interface) (the crystal rotates around the c-axis).

In a broad sense, the CAAC film means a non-single-crystal film including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis.

The CAAC film is not single crystal, but this does not mean that the CAAC film is composed of only an amorphous component. Although the CAAC film includes crystallized portions (crystalline portions), a boundary between one crystalline portion and another crystalline portion is not clear in some cases.

Nitrogen may be substituted for part of oxygen included in the CAAC film. The c-axes of individual crystalline portions included in the CAAC film may be aligned in one direction (e.g., the direction perpendicular to a surface of a substrate over which the CAAC film is formed, a surface of the CAAC film, an interface of the CAAC film, or the like). Alternatively, normals of the a-b planes of individual crystalline portions included in the CAAC film may be aligned in one direction (e.g., the direction perpendicular to the substrate surface or the surface or interface of the CAAC film).

The CAAC film becomes a conductor, a semiconductor, or an insulator depending on its composition or the like. The CAAC transmits or does not transmit visible light depending on its composition or the like.

Here, an oxide semiconductor film having an amorphous structure is formed as each of the oxide semiconductor films 122a and 122c.

The thickness of each of the oxide semiconductor films 122a and 122c is greater than or equal to 1 nm and less than or equal to 50 nm, preferably greater than or equal to 1 nm and less than or equal to 30 nm, more preferably greater than or equal to 1 nm and less than or equal to 10 nm, still more preferably greater than or equal to 3 nm and less than or equal to 7 nm. The thickness of each of the oxide semiconductor films 122a and 122c is in the above range, whereby the shift of the threshold voltage of the transistors in the negative direction can be suppressed.

Note that the concentration of an alkali metal or an alkaline earth metal in each of the oxide semiconductor films 122a and 122c is preferably lower than or equal to $1\times10^{18}$ atoms/cm$^3$, more preferably lower than or equal to $2\times10^{16}$ atoms/cm$^3$. This is because an alkali metal and an alkaline earth metal are bonded to an oxide semiconductor and generate carriers in some cases, which causes an increase in the off-state current of the transistor.

The first regions 123a and 123c of the oxide semiconductor films 122a and 122c may contain nitrogen at a concentration of lower than or equal to $5\times10^{18}$ atoms/cm$^3$.

The hydrogen concentration of each of the first regions 123a and 123c of the oxide semiconductor films 122a and 122c is preferably lower than $5\times10^{18}$ atoms/cm$^3$, more preferably $1\times10^{18}$ atoms/cm$^3$ or lower, further preferably $5\times10^{17}$ atoms/cm$^3$ or lower, still further preferably $1\times10^{16}$ atoms/cm$^3$ or lower. By a bond of an oxide semiconductor and hydrogen, part of contained hydrogen serves as a donor to generate electrons as carriers. For that reason, by a reduction in the concentration of hydrogen in each of the first regions 123a and 123c of the oxide semiconductor films 122a and 122c, the shift of the threshold voltage of the transistors in the negative direction can be reduced.

The second regions 125a to 125d containing dopant contain, as the dopant, at least one of boron, nitrogen, phosphorus, and arsenic. Alternatively, as the dopant, at least one of helium, neon, argon, krypton, and xenon is contained. Further alternatively, fluorine is contained as the dopant. Still alternatively, as the dopant, at least one of boron, nitrogen, phosphorus, and arsenic, at least one of helium, neon, argon, krypton, and xenon, and fluorine may be contained in appropriate combination.

The concentration of the dopant in each of the second regions 125a to 125d containing dopant is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the second regions 125a to 125d contain the dopant, the carrier density or the number of defects can be increased. Therefore, the conductivity can be higher than conductivity of the first regions 123a and 123c which do not contain dopant. Note that an excessive increase in the dopant concentration causes inhibition of carrier movement by the dopant, which leads to a reduction in conductivity of the second regions 125a to 125d containing dopant.

Each of the second regions 125a to 125d containing dopant preferably has a conductivity of higher than or equal to 0.1 S/cm and lower than or equal to 1000 S/cm, preferably higher than or equal to 10 S/cm and lower than or equal to 1000 S/cm.

The electrodes 115a to 115d are each formed to have a single-layer structure or a stacked-layer structure including, as a conductive material, any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used. Note that the electrodes 115a to 115d may also serve as wirings.

The pair of electrodes 115a and 115b covers side surfaces, particularly side surfaces parallel to the channel width direction, and part of a top surface of the oxide semiconductor film 122a, and the pair of electrodes 115c and 115d covers side surfaces, particularly side surfaces parallel to the channel width direction, and part of a top surface of the oxide semiconductor film 122c; therefore, contact areas between the pair of electrodes 115a and 115b and the oxide semiconductor film 122a and between the pair of electrodes 115c and 115d and the oxide semiconductor film 122c can be increased. Accordingly, the contact resistance between the oxide semiconductor film 122a and the pair of electrodes 115a and 115b and between the oxide semiconductor film 122c and the pair of electrodes 115c and 115d can be reduced, the channel width can be increased, and the on-state current of the transistors can be increased.

The gate insulating film 117 may be formed with a single layer or a stack using one or more of silicon oxide, silicon oxynitride, silicon nitride oxide, silicon nitride, aluminum oxide, hafnium oxide, gallium oxide, a Ga—Zn—O-based metal oxide, and the like. The gate insulating film 117 may be an oxide insulating film from which oxygen is released by heating, such as a film applicable to the insulating film 103. By using a film from which oxygen is released by heating as the gate insulating film 117, oxygen defects caused in the oxide semiconductor films 122a and 122c can be reduced and deterioration of electric characteristics of the transistors can be suppressed.

When the gate insulating film 117 is formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, gate leakage current can be decreased even when the thickness of the gate insulating film is reduced.

The thickness of the gate insulating film 117 is preferably greater than or equal to 10 nm and less than or equal to 300 nm, more preferably greater than or equal to 5 nm and less than or equal to 50 nm, still more preferably greater than or equal to 10 nm and less than or equal to 30 nm.

The gate electrodes 119a and 119c can each be formed using a metal element selected from aluminum, chromium, copper, tantalum, titanium, molybdenum, and tungsten; an alloy containing any of these metal elements as a component; an alloy containing these metal elements in combination; or the like. Further, one of or both manganese and zirconium may be used. The gate electrodes 119a and 119c may each have a single layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrodes 119a and 119c can each be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

As a material layer in contact with the gate insulating film 117, an In—Ga—Zn—O film containing nitrogen, an In—Sn—O film containing nitrogen, an In—Ga—O film containing nitrogen, an In—Zn—O film containing nitrogen, an Sn—O film containing nitrogen, an In—O film containing nitrogen, or a film of a metal nitride (such as InN or ZnN) is preferably provided between the gate electrodes 119a and 119c and the gate insulating film 117. These films each have a work function of higher than or equal to 5 eV, preferably higher than or equal to 5.5 eV; thus, the threshold voltage in the electric characteristics of the transistors can be positive. Accordingly, a so-called normally-off switching element can be obtained. For example, in the case of using an In—Ga—Zn—O film containing nitrogen, an In—Ga—Zn—O film having at least a higher nitrogen concentration than the oxide semiconductor films 122a and 122c, or specifically, an In—Ga—Zn—O film having a nitrogen concentration of 7 at. % or higher can be used.

The insulating film 127 may be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. The insulating film 127 may be formed using an oxide insulating film from which part of oxygen is released by heating in a manner similar to that of the insulating film 103. When the insulating film 127 is formed using an oxide insulating film which prevents diffusion of oxygen to the outside, oxygen released from the gate insulating film 117 can be supplied to the oxide semiconductor films 122a and 122c. In addition, by using an oxide insulating film which prevents diffusion of hydrogen from the outside as the insulating film 127, diffusion of hydrogen from the outside to the oxide semiconductor films 122a and 122c can be reduced, and oxygen defects in the oxide semiconductor films 122a and 122c can be reduced. Typical examples of the oxide insulating film which prevents diffusion of hydrogen from the outside include films of silicon nitride, silicon nitride oxide, aluminum nitride, aluminum nitride oxide, and the like.

Note that in this embodiment, a region between the pair of facing electrodes 115a and 115b and a region between the pair of facing electrodes 115c and 115d can each have a linear shape, a U shape, a C shape, or the like. When the region between the pair of facing electrodes 115a and 115b and the region between the pair of facing electrodes 115c and 115d each have a U shape, a C shape, or the like, the channel width can be increased and thus the on-state current can be increased.

Next, a method for manufacturing the transistors in FIG. 1 will be described with reference to FIGS. 2A to 2D and FIGS. 3A to 3C. Note that in each of FIGS. 2A to 2D and FIGS. 3A to 3C, cross-section A-B illustrates a manufacturing step of cross section A-B in FIG. 1, and cross section C-D illustrates a manufacturing step of cross-section C-D in FIG. 1.

Figure 2A:
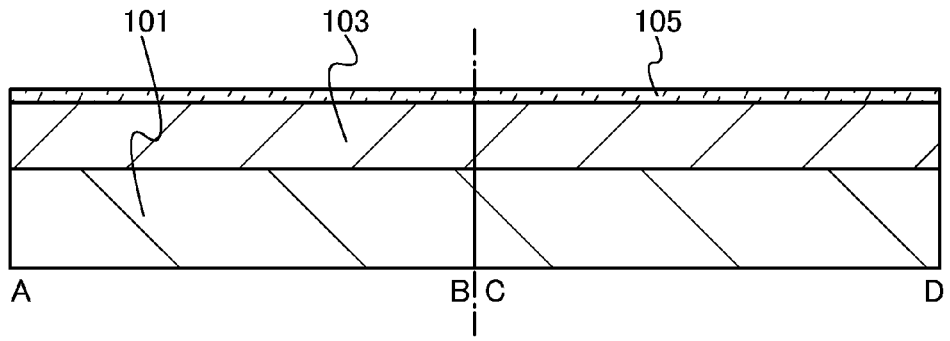
FIGS. 2A to 2D are cross-sectional views illustrating a method for manufacturing a semiconductor device according to an embodiment of the present invention.

As illustrated in FIG. 2A, the insulating film 103 and an oxide semiconductor film 105 are stacked over the substrate 101.

The insulating film 103 is formed by a sputtering method, a CVD method, or the like. It is preferable to use the oxide insulating film from which part of oxygen is released by heating because it is easily formed by a sputtering method.

When the oxide insulating film from which part of oxygen is released by heating is formed by a sputtering method, the amount of oxygen in a deposition gas is preferably large, and oxygen, a mixed gas of oxygen and a rare gas, or the like can be used. Typically, the oxygen concentration of a deposition gas is preferably higher than or equal to 6% and lower than or equal to 100%.

In the case where a silicon oxide film is formed as a typical example of such an oxide insulating film from which part of oxygen is released by heating, the silicon oxide film is preferably formed by an RF sputtering method under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa); the high-frequency power is higher than or equal to 0.5 kW and lower than or equal to 12 kW (preferably higher than or equal to 1 kW and lower than or equal to 5 kW); and the proportion of oxygen in the deposition gas ($O_2/(O_2+Ar)$) is higher than or equal to 1% and lower than or equal to 100% (preferably higher than or equal to 6% and lower than or equal to 100%). Note that a silicon target may be used as the target instead of the quartz (preferably synthetic quartz) target. In addition, oxygen alone may be used as the deposition gas.

Note that before the insulating film 103 is formed, hydrogen contained in the substrate is preferably released by heat treatment or plasma treatment. Consequently, in heat treatment performed later, diffusion of hydrogen to the insulating film 103 and the oxide semiconductor film 105 can be prevented. The heat treatment is performed at a temperature of higher than or equal to 100° C. and lower than the strain point of the substrate in an inert atmosphere, a reduced-pressure atmosphere, or a dry air atmosphere. Further, for the plasma treatment, rare gas, oxygen, nitrogen, or nitrogen oxide (e.g., nitrous oxide, nitrogen monoxide, or nitrogen dioxide) is used.

It is preferable that the insulating film 103 be planarized because an effect of preventing disconnection of the oxide semiconductor film 105 to be formed later can be obtained.

The oxide semiconductor film 105 can be formed in such a manner that film formation is performed by a sputtering method, a coating method, a printing method, a pulsed laser deposition method, or the like and then heat treatment is performed.

A sputtering apparatus used for forming the oxide semiconductor film 105 will be described in detail below.

The leakage rate of a treatment chamber in which the oxide semiconductor film 105 is formed is preferably lower than or equal to $1 \times 10^{-10}$ Pa·m$^3$/sec., whereby entry of an impurity into the film to be formed by a sputtering method can be decreased.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m$^3$/sec.

In order to reduce external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and thus the external leakage can be reduced. Further, by use of a metal material covered with iron fluoride, aluminum oxide, chromium oxide, or the like which is in the passive state, a released gas containing hydrogen generated from the metal gasket is suppressed, so that the internal leakage can also be reduced.

As a member for forming an inner wall of the treatment chamber, aluminum, chromium, titanium, zirconium, nickel, or vanadium, from which the amount of a released gas containing hydrogen is small, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the film formation apparatus may be covered with iron fluoride, aluminum oxide, chromium oxide, or the like which is in the passive state.

Furthermore, it is preferable to provide a refiner for a sputtering gas close to the treatment chamber. At this time, the length of a pipe between the gas refiner and the treatment chamber is less than or equal to 5 m, preferably less than or equal to 1 m. When the length of the pipe is less than or equal to 5 m or less than or equal to 1 m, the effect of the released gas from the pipe can be reduced accordingly.

Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Further, combination with a cryopump having a high capability in evacuating water or a sputter ion pump having a high capability in evacuating hydrogen is effective.

An adsorbate present at the inner wall of the treatment chamber does not affect the pressure in the treatment chamber because it is adsorbed on the inner wall, but the adsorbate leads to release of a gas at the time of the evacuation of the treatment chamber. Therefore, although the leakage rate and the evacuation rate do not have a correlation, it is important that the adsorbate present in the treatment chamber be removed as much as possible and evacuation be performed in advance with the use of a pump having high evacuation capability. Note that the treatment chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

As described above, in the process for forming the oxide semiconductor film and preferably in the process for forming the insulating film, entry of impurities is suppressed as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the insulating film to the oxide semiconductor film can be reduced.

Hydrogen contained in the oxide semiconductor reacts with oxygen bonded to a metal atom to produce water, and in addition, a defect is formed in a lattice from which oxygen is released (or a portion from which oxygen is removed). Thus, the impurities containing hydrogen are reduced as much as possible in the formation step of the oxide semiconductor film, whereby defects in the oxide semiconductor film can be reduced. Therefore, when a channel region is formed in an oxide semiconductor film which is purified by removing impurities as much as possible, the transistor can have higher reliability.

In a sputtering method, an RF power supply device, an AC power supply device, a DC power supply device, or the like can be used as a power supply device for generating plasma as appropriate.

As a target, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

An example of the target is a metal oxide target containing In, Ga, and Zn at a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used. Alternatively, a target having a composition ratio where $In_2O_3:ZnO=25:1$ to $1:4$ [molar ratio] can be used.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. It is preferable that a high-purity gas from which impurities containing hydrogen are removed be used as a sputtering gas.

In the case where a sputtering method is used, the substrate temperature is higher than or equal to 150° C. and lower than or equal to 450° C., preferably higher than or equal to 200° C. and lower than or equal to 350° C., whereby entry of moisture (including hydrogen) into the oxide semiconductor film can be prevented and the CAAC film can be formed.

Further, a region of the insulating film 103, which is in contact with the oxide semiconductor film, may be formed using an aluminum oxide film. Moreover, after the oxide semiconductor film 105 is formed, the oxide semiconductor film 105 may be irradiated with laser light. Through this step, the CAAC film can be formed from the interface with the insulating film 103.

Note that before the oxide semiconductor film is formed by a sputtering apparatus, a dummy substrate may be put into the sputtering apparatus, and an oxide semiconductor film may be formed over the dummy substrate, so that hydrogen and moisture attached to the target surface or a deposition shield may be removed.

Hydrogen can be released from the oxide semiconductor film in such a manner that the substrate 101 is subjected to heat treatment after the oxide semiconductor film is formed over the substrate 101 by the above method. Note that in the heat treatment, oxygen is also released from the oxide semiconductor film and oxygen defects remain in the oxide semiconductor film in some cases.

In the case where an oxide insulating film from which part of oxygen is released by heating is used as the insulating film 103, hydrogen is released from the oxide semiconductor film and part of oxygen contained in the insulating film 103 is diffused to the oxide semiconductor film and the vicinity of the interface between the insulating film 103 and the oxide semiconductor film by performing heat treatment on the substrate 101 after the oxide semiconductor film is formed over the substrate 101 by the above method. By the heat treatment, oxygen contained in the insulating film 103 is diffused to the oxide semiconductor film to reduce oxygen defects at the vicinity of the interface between the oxide semiconductor film and the insulating film. Note that under some heating conditions, oxygen is released from the oxide semiconductor film to the outside at the same time that oxygen is diffused from the insulating film 103 to the oxide semiconductor film; in this case, oxygen defects remain in the oxide semiconductor film. The oxygen defects particularly largely affect a transistor having a minute structure in which the channel length has a submicron size, which causes negative shift of the threshold voltage.

Hydrogen contained in the oxide semiconductor reacts with oxygen bonded to a metal atom to produce water, and in addition, a defect is formed in a lattice from which oxygen is released (or a portion from which oxygen is released). Therefore, the impurities containing hydrogen are reduced as much as possible by the heat treatment, whereby defects due to hydrogen in the oxide semiconductor film can be reduced.

Thus, as illustrated in FIG. 2A, the oxide semiconductor film 105 in which at least the hydrogen concentration is reduced can be formed.

The temperature of the heat treatment is preferably a temperature at which at least hydrogen is released from the oxide semiconductor film, more preferably a temperature at which hydrogen is released from the oxide semiconductor film and part of oxygen contained in the insulating film 103 is released and diffused to the oxide semiconductor film. The temperature is typically higher than or equal to 150° C. and lower than the strain point of the substrate, preferably higher than or equal to 250° C. and lower than or equal to 450° C., more preferably higher than or equal to 300° C. and lower than or equal to 450° C.

A rapid thermal annealing (RTA) apparatus can be used for the heat treatment. With the use of the RTA apparatus, the heat treatment can be performed at a temperature higher than or equal to the strain point of the substrate if the heating time is short. Therefore, time to release hydrogen from the oxide semiconductor film and to diffuse oxygen from the insulating film 103 to the oxide semiconductor film can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere or a reduced-pressure atmosphere. The treatment time is 3 minutes to 24 hours.

Figure 2B:
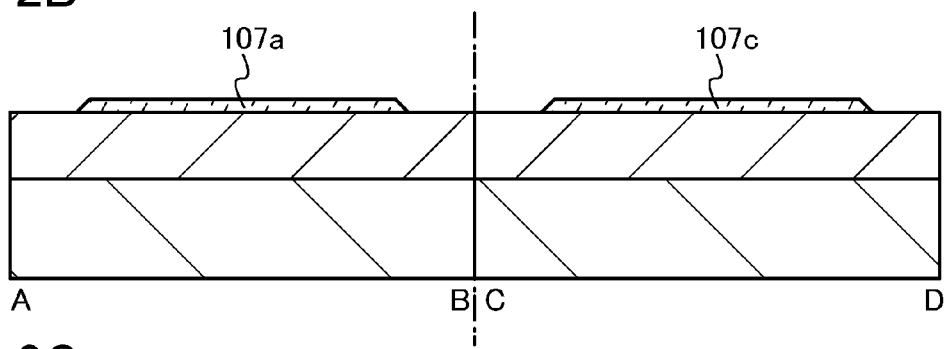

Next, as illustrated in FIG. 2B, the oxide semiconductor films 107a and 107c are formed. The oxide semiconductor films 107a and 107c are formed in such a manner that a mask is formed over the oxide semiconductor film 105 and part of the oxide semiconductor film 105 is selectively etched.

Figure 2C:
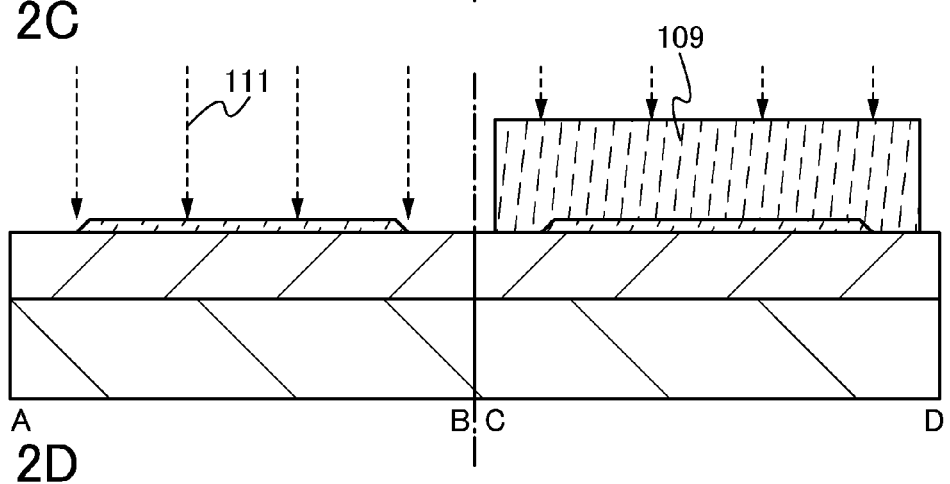
Figure 2D:
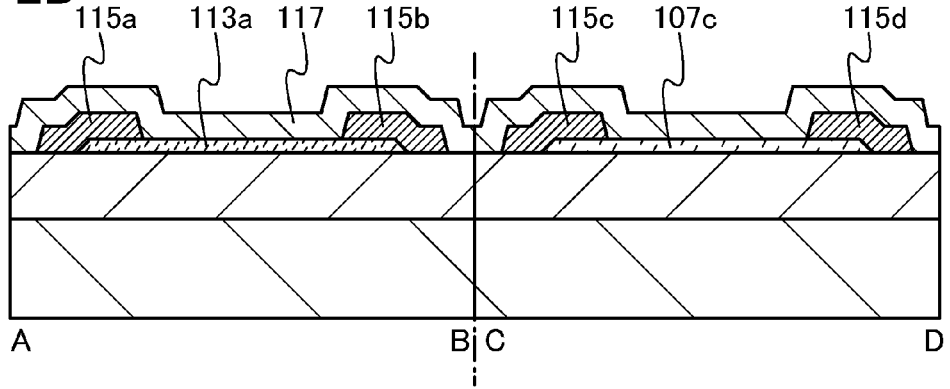

Next, as illustrated in FIG. 2C, a mask 109 is formed over the oxide semiconductor film 107c which is part of the transistor having high field-effect mobility and large on-state current, and then oxygen 111 is added to the oxide semiconductor film 107a. As a result, an oxide semiconductor film 113a in which oxygen defects are reduced as compared to the oxide semiconductor film 107c is formed (see FIG. 2D). Then, the mask 109 is removed.

Oxygen can be added to the oxide semiconductor film 107a by an ion doping method or an ion implantation method. Alternatively, as a method for adding oxygen, a plasma immersion ion implantation method may be used. By a plasma immersion ion implantation method, the oxygen can be added efficiently even when the oxide semiconductor film 107a has an uneven shape. Alternatively, oxygen can be added by a method other than an ion doping method, an ion implantation method, or the like. For example, oxygen can be added in such a manner that plasma is generated in an oxygen atmosphere and then the oxide semiconductor film 107a is subjected to plasma treatment in the oxygen atmosphere. As an apparatus for generating plasma, a dry etching apparatus, a plasma CVD apparatus, a high-density plasma CVD apparatus, or the like can be used.

At least one of an oxygen radical, an oxygen atom, and an oxygen ion is added to the oxide semiconductor film 107a as the oxygen 111. Further, the oxygen 111 is added to at least part of the oxide semiconductor film 107a, typically a surface of or the inside of the oxide semiconductor film 107a or the interface between the oxide semiconductor film 107a and the insulating film 103.

In the case where oxygen is added to the oxide semiconductor film 107a by an ion doping method or an ion implantation method, the amount of oxygen added to the oxide semiconductor film 107a is larger than or equal to $5 \times 10^{19}/cm^3$ and smaller than or equal to $5 \times 10^{21}/cm^3$. In this case, when the oxygen 111 has high energy, the oxide semiconductor film is damaged and physical defects are caused. Therefore, the oxygen 111 preferably has such energy which does not cause damage on the oxide semiconductor film.

The oxide semiconductor film 113a to which oxygen is added includes a region containing oxygen in excess of the stoichiometric ratio. Excess oxygen exists between lattices of the oxide semiconductor in some cases. The composition of such an oxide semiconductor can be expressed by $InGaZn_m O_{(m+3x)}$ ($x>1$, $m \geq 1$).

In the oxide semiconductor, oxygen is one of main component materials. Thus, it is difficult to accurately estimate the oxygen concentration of the oxide semiconductor film by a method such as secondary ion mass spectrometry (SIMS). In other words, it can be said that it is hard to determine whether or not oxygen is intentionally added to the oxide semiconductor film.

Incidentally, it is known that oxygen has isotopes such as $^{17}O$ and $^{18}O$ and the proportions of $^{17}O$ and $^{18}O$ in all of the oxygen atoms in nature is about 0.037% and about 0.204%, respectively. That is to say, it is possible to measure the concentrations of these isotopes in the oxide semiconductor film by a method such as SIMS; therefore, the oxygen concentration of the oxide semiconductor film may be able to be estimated more accurately by measuring the concentrations of these isotopes. Thus, the concentration of the isotope may be measured to determine whether or not oxygen is intentionally added to the oxide semiconductor film.

The oxygen defects in the oxide semiconductor film 113a can be reduced by addition of oxygen to the oxide semiconductor film 107a. In contrast, oxygen is not added to the oxide semiconductor film 107c, so that the oxygen defects remains in the oxide semiconductor film 107c more than in the oxide semiconductor film 113a.

Next, the pair of electrodes 115a and 115b is formed over the oxide semiconductor film 113a and the pair of electrodes 115c and 115d is formed over the oxide semiconductor film 107c. Then, the gate insulating film 117 covering the electrodes 115a to 115d and the oxide semiconductor films 113a and 107c is formed.

The electrodes 115a to 115d are formed by a printing method or an inkjet method. Alternatively, the electrodes 115a to 115d are formed in such a manner that after a conductive film is formed by a sputtering method, a CVD method, an evaporation method, or the like, a mask is formed over the conductive film and the conductive film is etched. The mask formed over the conductive film can be formed by a printing method, an inkjet method, or a photolithography method as appropriate. In the case of forming the electrodes 115a to 115d with the use of a mask, the mask is removed later.

The gate insulating film 117 is formed by a sputtering method, a CVD method, or the like.

Figure 3A:
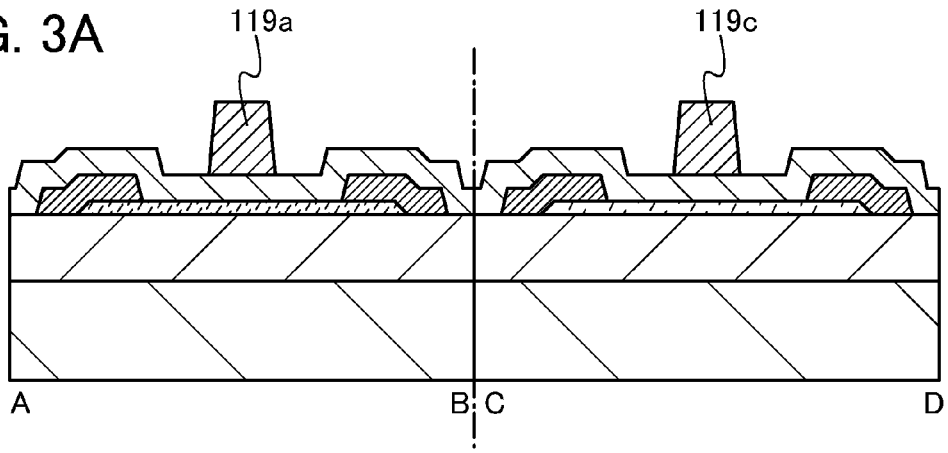
FIGS. 3A to 3C are cross-sectional views illustrating a method for manufacturing a semiconductor device according to an embodiment of the present invention.

Next, as illustrated in FIG. 3A, the gate electrodes 119a and 119c are formed over the gate insulating film 117.

The gate electrodes 119a and 119c are formed by a printing method or an inkjet method. Alternatively, the gate electrodes 119a and 119c are formed in such a manner that after a conductive film is formed by a sputtering method, a CVD method, an evaporation method, or the like, a mask is formed over the conductive film and the conductive film is etched. The mask formed over the conductive film can be formed by a printing method, an inkjet method, or a photolithography method as appropriate. In the case of forming the gate electrodes 119a and 119c with the use of a mask, the mask is removed later.

Figure 3B:
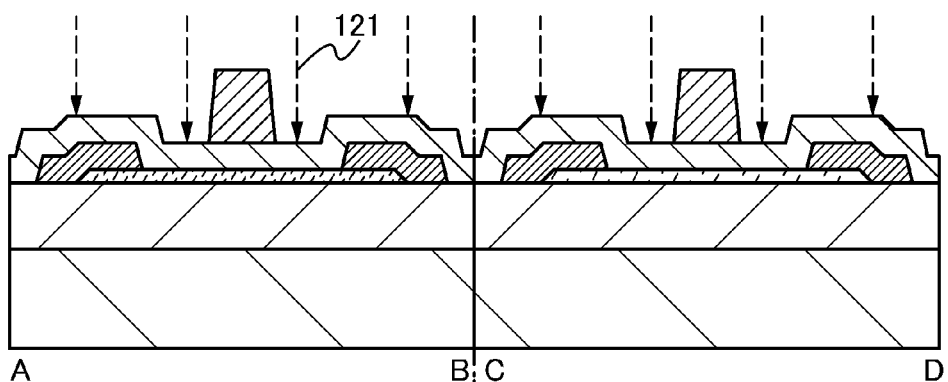
Figure 3C:
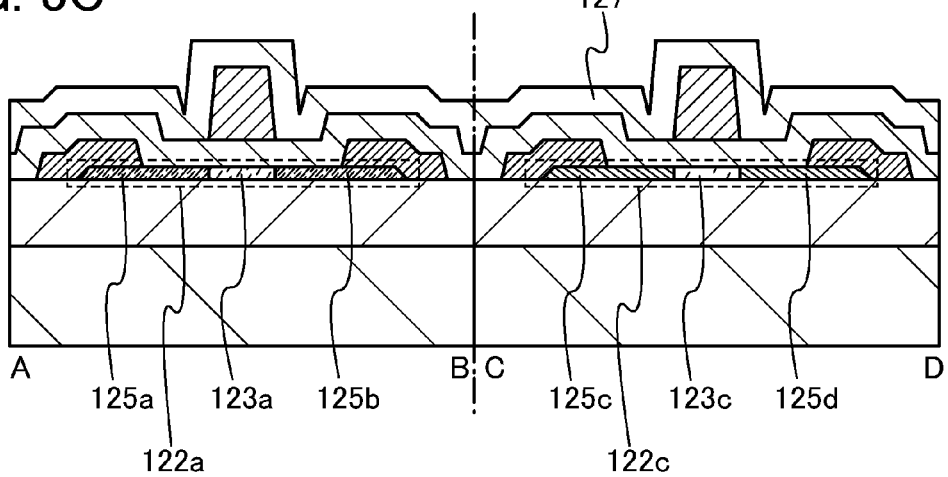

Next, as illustrated in FIG. 3B, treatment for adding dopant 121 to the oxide semiconductor films 113a and 107c is performed with the use of the gate electrodes 119a and 119c as masks. As a result, as illustrated in FIG. 3C, the pair of second regions 125a and 125b containing dopant is formed in cross section A-B. Since the dopant is added with the use of the gate electrode 119a as a mask, the pair of second regions 125a and 125b containing dopant and the first region 123a to which the dopant is not added can be formed in a self-aligned manner. The first region 123a which overlaps with the gate electrode 119a serves as a channel region. Regions in the pair of second regions 125a and 125b containing dopant, which overlap with the pair of electrodes 115a and 115b, serve as a source region and a drain region. Further, source-drain breakdown voltage can be increased with regions in the pair of second regions 125a and 125b containing dopant, which are not in contact with the pair of electrodes 115a and 115b. The oxide semiconductor film 122a includes the first region 123a and the pair of second regions 125a and 125b containing dopant.

In cross section C-D, the pair of second regions 125c and 125d containing dopant is formed. Since the dopant is added with the use of the gate electrode 119c as a mask, the pair of second regions 125c and 125d containing dopant and the first region 123c to which the dopant is not added can be formed in a self-aligned manner. The first region 123c which overlaps with the gate electrode 119c serves as a channel region. Regions in the pair of second regions 125c and 125d containing dopant, which overlap with the pair of electrodes 115c and 115d, serve as a source region and a drain region. Further, source-drain breakdown voltage can be increased with regions in the pair of second regions 125c and 125d containing dopant, which are not in contact with the pair of electrodes 115c and 115d. The oxide semiconductor film 122c includes the first region 123c and the pair of second regions 125c and 125d containing dopant.

The dopant passing through the electrodes 115a to 115d is added to part of the second regions 125a to 125d. Even when defects due to damage by the energy of the dopant are caused in the second regions 125a to 125d, the defects serve as a source of generation of carriers and the film resistance is reduced; therefore, the energy of the dopant can be increased as compared to the case of addition of the oxygen 111 illustrated in FIG. 2C.

As a method for adding the dopant to the oxide semiconductor films 113a and 107c, an ion doping method or an ion implantation method can be used. As the dopant, at least one of boron, nitrogen, phosphorus, and arsenic can be added. Alternatively, as the dopant, at least one of helium, neon, argon, krypton, and xenon can be added. Further alternatively, fluorine may be added as the dopant. Still alternatively, as the dopant, at least one of boron, nitrogen, phosphorus, and arsenic, at least one of helium, neon, argon, krypton, and xenon, and fluorine may be added in combination as appropriate.

Here, the dopant is added to the oxide semiconductor films 113a and 107c in a state where the oxide semiconductor films 113a and 107c are covered with the insulating film and the like; alternatively, the dopant may be added in a state where the oxide semiconductor films 113a and 107c are exposed.

Alternatively, the dopant can be added by a method other than an ion doping method, an ion implantation method, or the like. For example, dopant can be added in the following manner: plasma is generated in an atmosphere of a gas containing an element to be added and plasma treatment is performed on an object to which the dopant is added. A dry etching apparatus, a plasma CVD apparatus, or the like can be used as an apparatus for generating plasma.

After that, heat treatment may be performed. The heat treatment is performed typically at a temperature of higher than or equal to 150° C. and lower than or equal to 450° C., preferably higher than or equal to 300° C. and lower than or equal to 450° C. Alternatively, the heat treatment may be performed while the temperature is gradually increased from 150° C. to 450° C.

Through the heat treatment, the resistance of the second regions 125a to 125d containing dopant can be reduced. In the heat treatment, the second regions 125a to 125d containing dopant may be in either a crystalline state or an amorphous state. Further, oxygen is diffused from the gate insulating film 117 into the oxide semiconductor films, so that the oxygen defects contained in the oxide semiconductor films can be reduced. Note that the amount of oxygen diffused into the oxide semiconductor films in this step is smaller than the amount of oxygen added in the step illustrated in FIG. 2C. Therefore, oxygen defects in the oxide semiconductor film 122c are reduced but still remain.

The insulating film 127 can be formed in a manner similar to that of the gate insulating film 117.

Through the above-described process, the transistors 120a and 120c illustrated in FIG. 1 can be manufactured.

In the transistors 120a and 120c, hydrogen is intentionally removed from the oxide semiconductor film by heat treatment for dehydrogenation and then oxygen is selectively added to the oxide semiconductor film; thus, oxygen which is one of main components of the oxide semiconductor film can be supplied to the oxide semiconductor film. Thus, the oxide semiconductor film can be highly purified and become an electrically i-type (intrinsic) semiconductor.

Further, by selective addition of oxygen, the oxygen defects which are not removed by the heat treatment in the oxide semiconductor film or at the interface can be reduced and the donor level in the energy gap due to the oxygen defects can be reduced or substantially removed. Accordingly, the current at negative gate voltage of the transistor 120a can be reduced.

Oxygen is added to the oxide semiconductor film 122a included in the transistor 120a in this embodiment and the oxide semiconductor film 122a includes fewer oxygen defects. Therefore, the current at negative gate voltage of the transistor 120a is small. On the other hand, oxygen is not added to the oxide semiconductor film 122c included in the transistor 120c and the oxide semiconductor film 122c includes oxygen defects. Therefore, carriers are easily generated in the transistor 120c in an on state. Accordingly, the transistor 120c has high field-effect mobility and large on-state current. Thus, by selective addition of oxygen to an oxide semiconductor film, a transistor having small current at negative gate voltage and a transistor having high field-effect mobility and large on-state current can be manufactured over the same substrate.

(Embodiment 2)

In this embodiment, a transistor having a structure different from that of Embodiment 1 and a method for manufacturing the transistor will be described with reference to FIGS. 2A to 2D, FIG. 4, and FIGS. 5A to 5C. Coplanar transistors each having a top gate structure are described in this embodiment.

Figure 4:
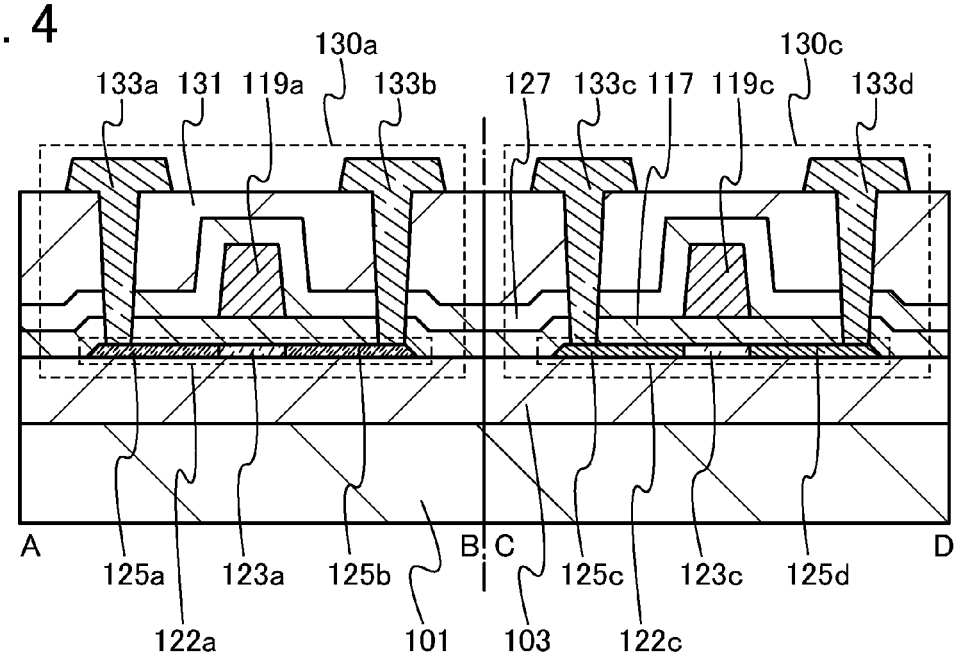
FIG. 4 is a cross-sectional view illustrating a semiconductor device according to an embodiment of the present invention.

FIG. 4 is a cross-sectional view of a semiconductor device described in this embodiment. The semiconductor device illustrated in FIG. 4 includes a transistor 130a having small current at negative gate voltage and a transistor 130c having high field-effect mobility and large on-state current.

The transistor 130a having small current at negative gate voltage includes the insulating film 103 over the substrate 101, the oxide semiconductor film 122a over the insulating film 103, the gate insulating film 117 covering the oxide semiconductor film 122a, and the gate electrode 119a which is provided over the gate insulating film 117 and overlaps with the oxide semiconductor film 122a. The insulating film 127 and an insulating film 131 are stacked over the gate insulating film 117 and the gate electrode 119a. A pair of electrodes 133a and 133b which is formed in opening portions formed in the gate insulating film 117, the insulating film 127, and the insulating film 131 and in contact with the oxide semiconductor film 122a is included. The oxide semiconductor film 122a has a structure similar to that in Embodiment 1 and includes the first region 123a overlapping with the gate electrode 119a and the pair of second regions 125a and 125b between which the first region 123a is sandwiched and which contains dopant.

The transistor 130c having high field-effect mobility and large on-state current includes the insulating film 103 over the substrate 101, the oxide semiconductor film 122c over the insulating film 103, the gate insulating film 117 covering the oxide semiconductor film 122c, and the gate electrode 119c which is provided over the gate insulating film 117 and overlaps with the oxide semiconductor film 122c. The insulating film 127 and an insulating film 131 are stacked over the gate insulating film 117 and the gate electrode 119c. A pair of electrodes 133c and 133d which is formed in opening portions formed in the gate insulating film 117, the insulating film 127, and the insulating film 131 and in contact with the oxide semiconductor film 122c is included. The oxide semiconductor film 122c has a structure similar to that in Embodiment 1 and includes the first region 123c overlapping with the gate electrode 119c and the pair of second regions 125c and 125d between which the first region 123c is sandwiched and which contains dopant.

Oxygen is added to the oxide semiconductor film 122a and oxygen is not added to the oxide semiconductor film 122c. In other words, the oxide semiconductor film 122a includes fewer oxygen defects than the oxide semiconductor film 122c.

It is preferable that the insulating film 127 covering the transistors 130a and 130c be formed.

The transistor described in this embodiment is a coplanar transistor, so that the transistor can be miniaturized.

The insulating film 131 can be formed in a manner similar to that of the insulating film 127. When the insulating film 131 is formed using an inorganic material such as borophosphosilicate glass (BPSG), or an organic material such as polyimide or acrylic, planarity of the insulating film 131 can be increased.

The electrodes 133a to 133d can be formed using a material similar to that of the electrodes 115a to 115d in Embodiment 1 as appropriate.

Next, a method for manufacturing the transistors 130a and 130c in FIG. 4 will be described with reference to FIGS. 2A to 2D and FIGS. 5A to 5C. Note that in each of FIGS. 2A to 2D and FIGS. 5A to 5C, cross-section A-B illustrates a manufacturing step of cross section A-B in FIG. 4, and cross section C-D illustrates a manufacturing step of cross-section C-D in FIG. 4.

Figure 5A:
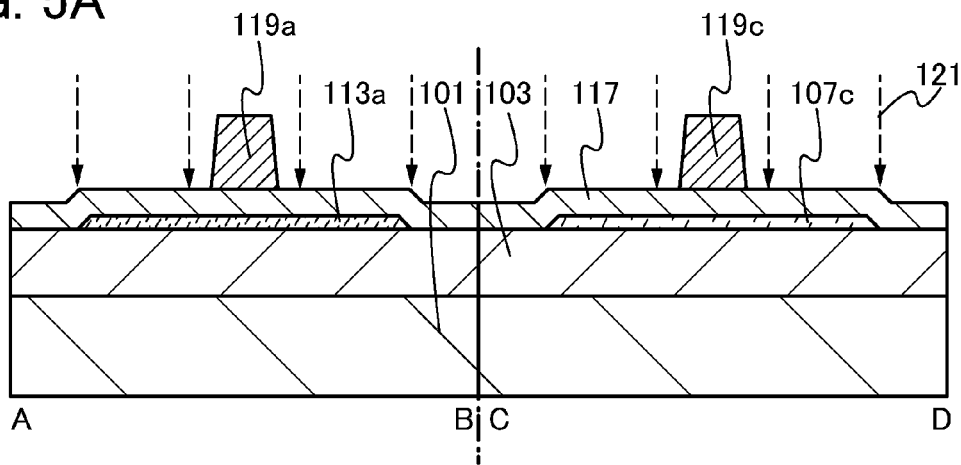
FIGS. 5A to 5C are cross-sectional views illustrating a method for manufacturing a semiconductor device according to an embodiment of the present invention.

Through the steps illustrated in FIGS. 2A to 2C, the insulating film 103 is formed over the substrate 101 as illustrated in FIG. 5A. Then, the oxide semiconductor films 113a and 107c are formed over the insulating film 103. Note that the oxide semiconductor films 113a and 107c are oxide semiconductor films which are subjected to heat treatment for dehydrogenation treatment.

Next, after the gate insulating film 117 is formed over the oxide semiconductor films 113a and 107c in a manner similar to that in Embodiment 1, the gate electrodes 119a and 119c are formed over the gate insulating film 117.

Figure 5B:
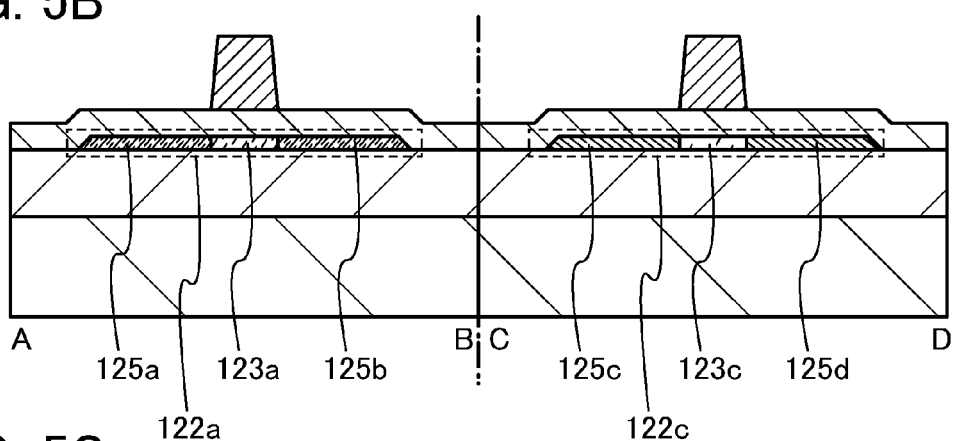

Next, treatment for adding the dopant 121 to the oxide semiconductor films 113a and 107c is performed with the use of the gate electrodes 119a and 119c as masks. As a result, as illustrated in FIG. 5B, the pair of second regions 125a and 125b containing dopant is formed in cross section A-B. Since the dopant is added with the use of the gate electrode 119a as a mask, the pair of second regions 125a and 125b containing dopant and the first region 123a to which the dopant is not added can be formed in a self-aligned manner. The first region 123a which overlaps with the gate electrode 119a serves as a channel region. The oxide semiconductor film 122a includes the first region 123a and the pair of second regions 125a and 125b containing dopant.

In cross section C-D, the pair of second regions 125c and 125d containing dopant is formed. Since the dopant is added with the use of the gate electrode 119c as a mask, the pair of second regions 125c and 125d containing dopant and the first region 123c to which the dopant is not added can be formed in a self-aligned manner. The first region 123c which overlaps with the gate electrode 119c serves as a channel region. The oxide semiconductor film 122c includes the first region 123c and the pair of second regions 125c and 125d containing dopant.

After that, heat treatment may be performed.

Figure 5C:
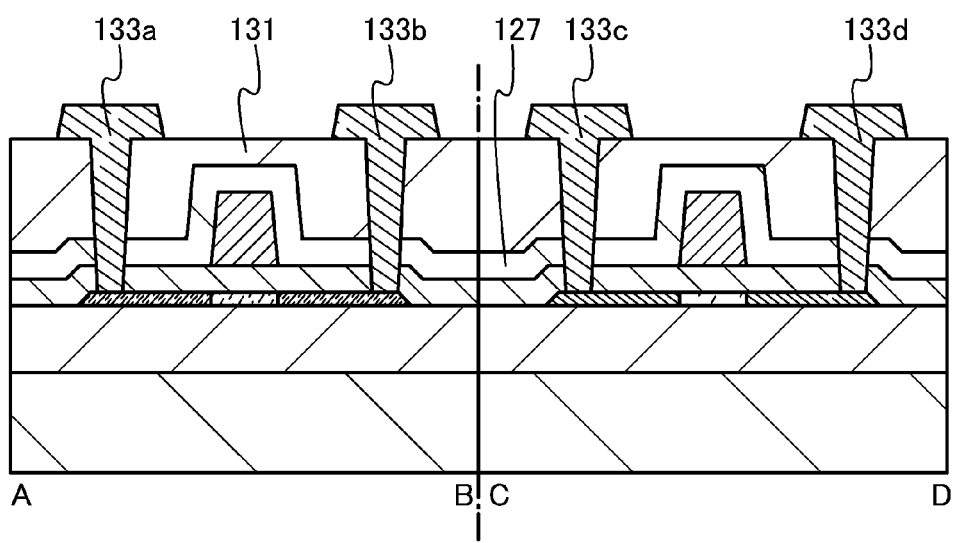

Next, as illustrated in FIG. 5C, the insulating film 127 and the insulating film 131 are formed over the gate insulating film 117 and the gate electrodes 119a and 119c. The insulating film 131 can be formed by a sputtering method, a CVD method, a coating method, a printing method, or the like as appropriate.

Next, parts of the gate insulating film 117, the insulating film 127, and the insulating film 131 are removed, so that the opening portions are formed. Then, the pair of electrodes 133a and 133b which is in contact with the pair of second regions 125a and 125b in the oxide semiconductor film 122a through the opening portions and the pair of electrodes 133c and 133d which is in contact with the pair of second regions 125c and 125d in the oxide semiconductor film 122c through the opening portions are formed. The electrodes 133a to 133d are formed in a manner similar to that of the electrodes 115a to 115d.

According to this embodiment, oxygen is selectively added to an oxide semiconductor film after a dehydrogenation step, so that a transistor having small current at negative gate voltage and a transistor having high field-effect mobility and large on-state current can be manufactured over the same substrate.

(Embodiment 3)

In this embodiment, a transistor having a structure different from the structures of Embodiments 1 and 2 and a method for manufacturing the transistor will be described with reference to FIGS. 2A to 2D, FIG. 6, FIGS. 7A to 7C, and FIGS. 8A to 8C. The transistor described in this embodiment includes an oxide semiconductor film having a structure different from that in Embodiment 1.

Figure 6:
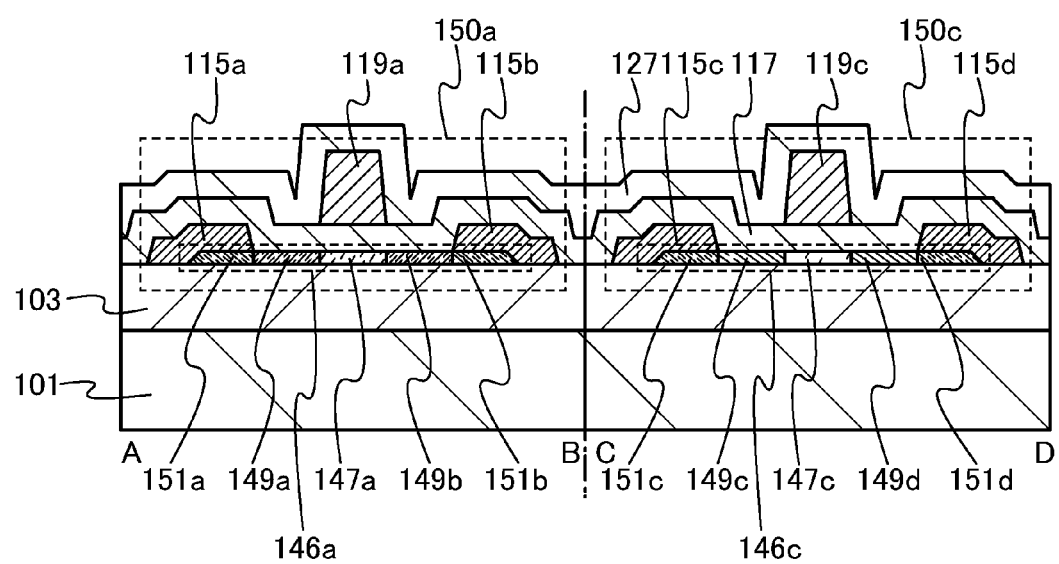
FIG. 6 is a cross-sectional view illustrating a semiconductor device according to an embodiment of the present invention.

FIG. 6 is a cross-sectional view of a semiconductor device described in this embodiment. The semiconductor device illustrated in FIG. 6 includes a transistor 150a having small current at negative gate voltage and a transistor 150c having high field-effect mobility and large on-state current.

The transistor 150a having small current at negative gate voltage includes the insulating film 103 over the substrate 101, an oxide semiconductor film 146a over the insulating film 103, the pair of electrodes 115a and 115b which is in contact with the oxide semiconductor film 146a and serves as a source electrode and a drain electrode, the gate insulating film 117 covering the oxide semiconductor film 146a, and the gate electrode 119a which is provided over the gate insulating film 117 and overlaps with the oxide semiconductor film 146a. The oxide semiconductor film 146a includes a first region 147a overlapping with the gate electrode 119a, a pair of second regions 149a and 149b between which the first region 147a is sandwiched and which contains dopant, and a pair of third regions 151a and 151b between which the pair of second regions is sandwiched and which contains dopant. In the oxide semiconductor film 146a, the first region 147a serves as a channel region, the pair of second regions 149a and 149b containing dopant serves as electric-field relaxation regions, and the pair of third regions 151a and 151b containing dopant serves as a source region and a drain region.

The transistor 150c having high field-effect mobility and large on-state current includes the insulating film 103 over the substrate 101, an oxide semiconductor film 146c over the insulating film 103, the pair of electrodes 115c and 115d which is in contact with the oxide semiconductor film 146c and serves as a source electrode and a drain electrode, the gate insulating film 117 covering the oxide semiconductor film 146c, and the gate electrode 119c which is provided over the gate insulating film 117 and overlaps with the oxide semiconductor film 146a. The oxide semiconductor film 146c includes a first region 147c overlapping with the gate electrode 119c, a pair of second regions 149c and 149d between which the first region 147c is sandwiched and which contains dopant, and a pair of third regions 151c and 151d between which the pair of second regions is sandwiched and which contains dopant. In the oxide semiconductor film 146c, the first region 147c serves as a channel region, the pair of second regions 149c and 149d containing dopant serves as electric-field relaxation regions, and the pair of third regions 151c and 151d containing dopant serves as a source region and a drain region.

It is preferable that the insulating film 127 covering the transistors 150a and 150c be formed.

In the oxide semiconductor film 146a, the oxygen concentration of the first region 147a and the oxygen concentration of the pair of second regions 149a and 149b are higher than that of the pair of third regions 151a and 151b. This is because oxygen is added to the oxide semiconductor films 107a and 107c after the electrodes 115a to 115d are formed.

In other words, the concentration of oxygen added to the first region 147a is higher than or equal to $5\times10^{19}/cm^3$ and lower than or equal to $5\times10^{21}/cm^3$. The concentration of oxygen added to the pair of second regions 149a and 149b is higher than or equal to $1\times10^{18}/cm^3$ and lower than or equal to $5\times10^{21}/cm^3$ and the dopant concentration of the pair of second regions 149a and 149b is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$. The dopant concentration of the pair of third regions 151a and 151b is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

On the other hand, oxygen is not added to the first region 147c, the pair of second regions 149c and 149d, and the pair of third regions 151c and 151d in the oxide semiconductor film 146c. In other words, the oxygen concentration of the first region 147c, the oxygen concentration of the pair of second regions 149c and 149d, and the oxygen concentration of the pair of third regions 151c and 151d are lower than the oxygen concentration of the first region 147a and the oxygen concentration of the pair of second regions 149a and 149b in the oxide semiconductor film 146a. The dopant concentration of the pair of second regions 149c and 149d and the dopant concentration of the pair of third regions 151c and 151d are each higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

In the transistor 150a described in this embodiment, oxygen is not added to the pair of third regions 151a and 151b serving as a source region and a drain region. In other words, oxygen defects remain in those regions. Therefore, carriers are easily generated in the pair of third regions 151a and 151b and film resistance can be reduced. On the other hand, oxygen is added to the first region 147a and the pair of second regions 149a and 149b; thus, oxygen defects are reduced. Accordingly, the transistor 150a has small current at negative gate voltage and larger on-state current than the transistors 120a and 130a in Embodiments 1 and 2.

Next, a method for manufacturing the transistors 150a and 150c in FIG. 6 will be described with reference to FIGS. 2A to 2D, FIGS. 7A to 7C, and FIGS. 8A to 8C. Note that in each of FIGS. 2A to 2D, FIGS. 7A to 7C, and FIGS. 8A to 8C, cross-section A-B illustrates a manufacturing step of cross section A-B in FIG. 6, and cross section C-D illustrates a manufacturing step of cross-section C-D in FIG. 6.

Figure 7A:
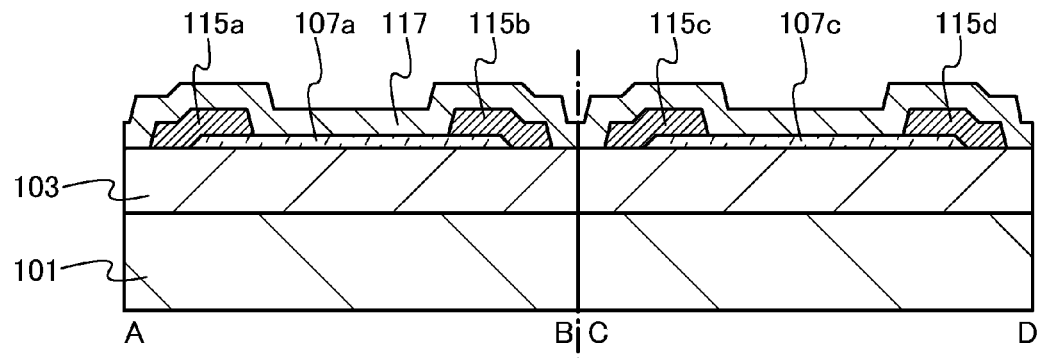
FIGS. 7A to 7C are cross-sectional views illustrating a method for manufacturing a semiconductor device according to an embodiment of the present invention.

Through the steps illustrated in FIGS. 2A and 2B, the insulating film 103 is formed over the substrate 101 as illustrated in FIG. 7A. Then, the oxide semiconductor films 107a and 107c are formed over the insulating film 103. Note that the oxide semiconductor films 107a and 107c are oxide semiconductor films which are subjected to heat treatment for dehydrogenation treatment.

Next, the electrodes 115a to 115d are formed over the oxide semiconductor films 107a and 107c by a method similar to that in Embodiment 1. Next, the gate insulating film 117 is formed over the oxide semiconductor films 107a and 107c and the electrodes 115a to 115d by a method similar to that in Embodiment 1.

Figure 7B:
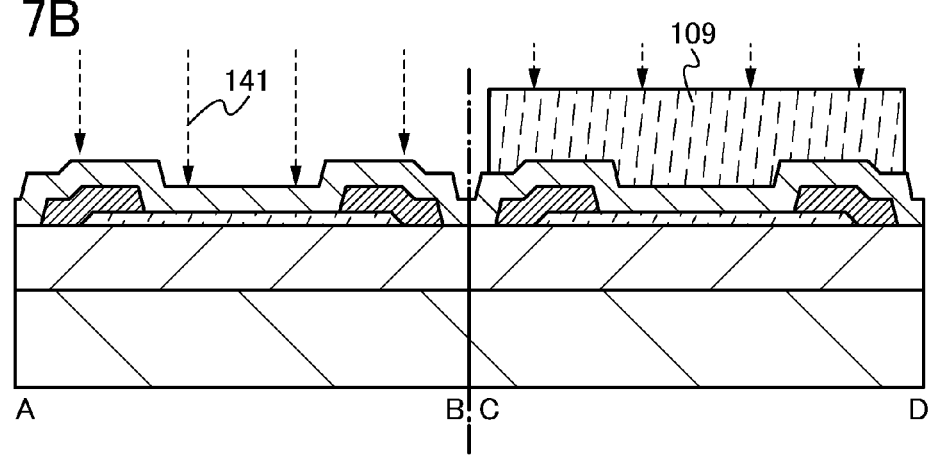

Next, as illustrated in FIG. 7B, the mask 109 is formed over the oxide semiconductor film 107c which is part of the transistor having high field-effect mobility and large on-state current, and then oxygen 141 is added to the oxide semiconductor film 107a. The oxygen 141 can be added in a manner similar to that of the oxygen 111 in Embodiment 1. Then, the mask 109 is removed.

In this embodiment, oxygen is added to the oxide semiconductor film 107a through the gate insulating film 117; therefore, a region to which oxygen is added (depth to which oxygen is implanted) can be controlled more easily, leading to efficient addition of oxygen to the oxide semiconductor film 107a.

Figure 7C:
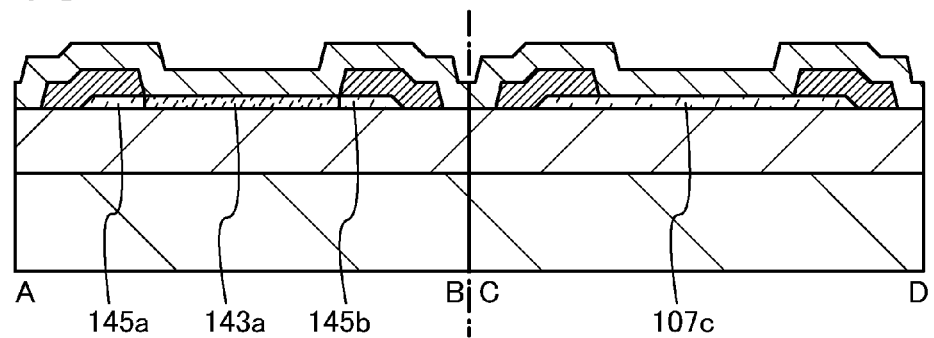

As a result, as illustrated in FIG. 7C, oxygen is added to a region of the oxide semiconductor film 107a, which does not overlap with either of the pair of electrodes 115a and 115b. Thus, a region 143a to which oxygen is added and regions 145a and 145b to which oxygen is not added can be formed. In other words, the region 143a includes fewer oxygen defects than the oxide semiconductor film 107c and the regions 145a and 145b.

Figure 8A:
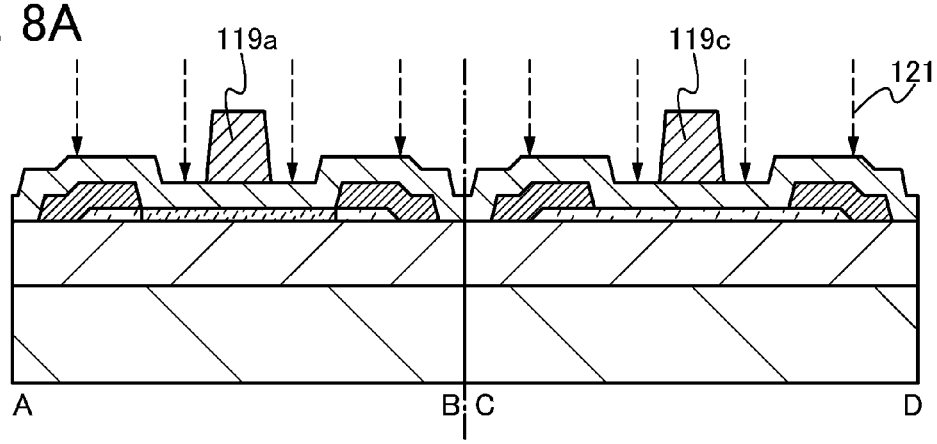
FIGS. 8A to 8C are cross-sectional views illustrating a method for manufacturing a semiconductor device according to an embodiment of the present invention.

Next, as illustrated in FIG. 8A, the gate electrodes 119a and 119c are formed. Then, in a manner similar to that in Embodiment 1, the dopant 121 is added to the region 143a and the regions 145a and 145b in the oxide semiconductor film to which oxygen is added and the oxide semiconductor film 107c with the use of the gate electrodes 119a and 119c as masks.

Figure 8B:
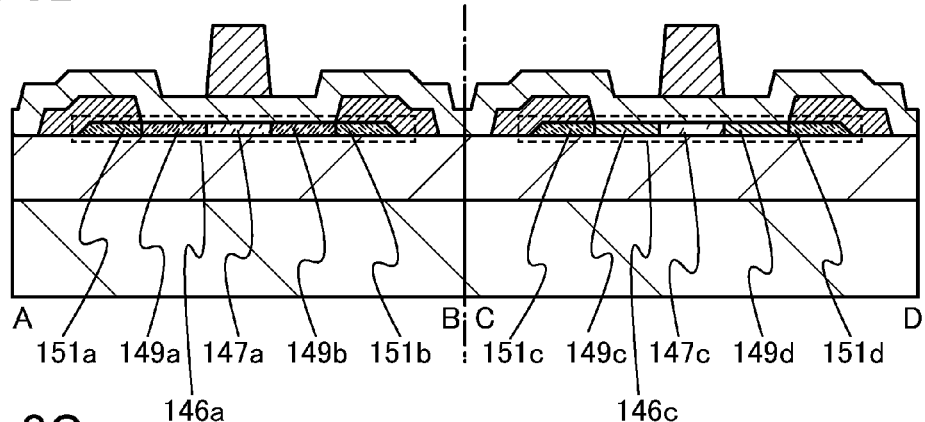

As a result, as illustrated in FIG. 8B, the pair of second regions 149a and 149b containing dopant and the pair of third regions 151a and 151b containing dopant are formed in cross section A-B. Since the dopant is added with the use of the gate electrode 119a as a mask, the pair of second regions 149a and 149b containing dopant, the pair of third regions 151a and 151b containing dopant, and the first region 147a to which the dopant is not added can be formed in a self-aligned manner. The first region 147a which overlaps with the gate electrode 119a serves as a channel region. The pair of the second regions 149a and 149b containing dopant serves as electric-field relaxation regions. The pair of third regions 151a and 151b containing dopant serves as a source region and a drain region. The oxide semiconductor film 146a includes the first region 147a, the pair of second regions 149a and 149b containing dopant, and the pair of third regions 151a and 151b containing dopant.

Further, the pair of second regions 149c and 149d containing dopant and the pair of third regions 151c and 151d containing dopant are formed in cross section C-D. Since the dopant is added with the use of the gate electrode 119c as a mask, the pair of second regions 149c and 149d containing dopant, the pair of third regions 151c and 151d containing dopant, and the first region 147c to which the dopant is not added can be formed in a self-aligned manner. The first region 147c which overlaps with the gate electrode 119c serves as a channel region. The pair of the second regions 149c and 149d containing dopant serves as electric-field relaxation regions. The pair of third regions 151c and 151d containing dopant serves as a source region and a drain region. The oxide semiconductor film 146c includes the first region 147c, the pair of second regions 149c and 149d containing dopant, and the pair of third regions 151c and 151d containing dopant.

After that, heat treatment may be performed.

Through the above-described steps, the transistors 150a and 150c illustrated in FIG. 6 can be manufactured.

Figure 8C:
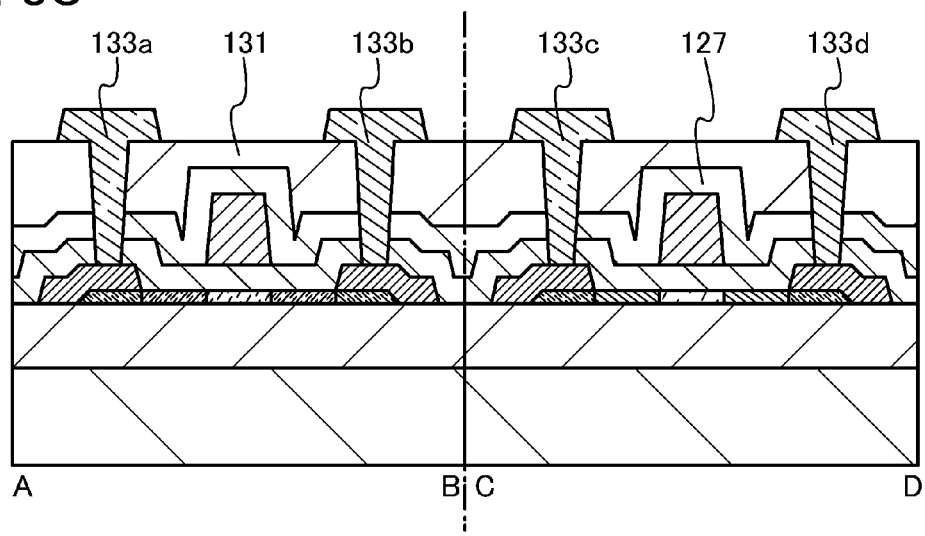

After that, as illustrated in FIG. 8C, the insulating film 127 and the insulating film 131 are formed over the gate insulating film 117 and the gate electrodes 119a and 119c in a manner similar to that in Embodiment 2. Next, parts of the gate insulating film 117, the insulating film 127, and the insulating film 131 are removed, so that the opening portions are formed. Then, the pair of electrodes 133a and 133b which is in contact with the pair of electrodes 115a and 115b through the opening portions and the pair of electrode 133c and 133d which is in contact with the pair of electrodes 115c and 115d through the opening portions may be formed.

According to this embodiment, oxygen is selectively added to an oxide semiconductor film after a dehydrogenation step, so that a transistor having small current at negative gate voltage and a transistor having high field-effect mobility and large on-state current can be manufactured over the same substrate.

(Embodiment 4)

In this embodiment, a transistor having a structure different from the structures of Embodiments 1 to 3 and a method for manufacturing the transistor will be described with reference to FIGS. 2A to 2D, FIG. 9, and FIGS. 10A to 10C. The transistor described in this embodiment is different from those described in Embodiments 1 to 3 in that sidewall insulating films are provided on side surfaces of a gate electrode.

Figure 9:
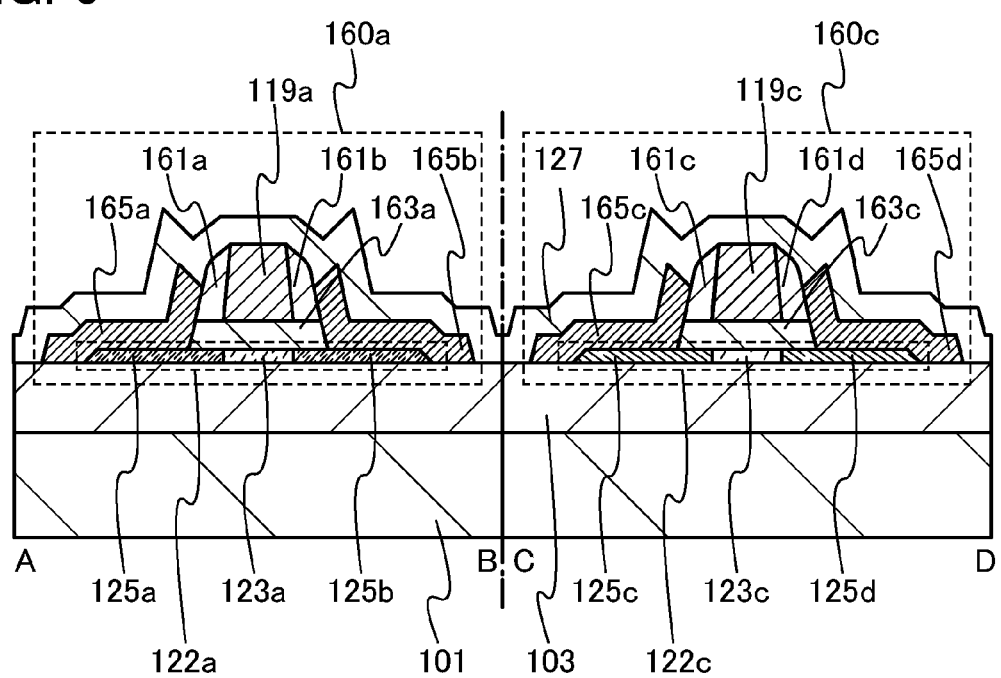
FIG. 9 is a cross-sectional view illustrating a semiconductor device according to an embodiment of the present invention.

FIG. 9 is a cross-sectional view of a semiconductor device described in this embodiment. The semiconductor device illustrated in FIG. 9 includes a transistor 160a having small current at negative gate voltage and a transistor 160c having high field-effect mobility and large on-state current.

The transistor 160a having small current at negative gate voltage includes the insulating film 103 over the substrate 101, the oxide semiconductor film 122a over the insulating film 103, a pair of electrodes 165a and 165b which is in contact with the oxide semiconductor film 122a and serves as a source electrode and a drain electrode, a gate insulating film 163a covering part of the oxide semiconductor film 122a, the gate electrode 119a which is provided over the gate insulating film 163a and overlaps with the oxide semiconductor film 122a, and sidewall insulating films 161a and 161b which are provided on side surfaces of the gate electrode 119a. In the transistor 160a, the pair of electrodes 165a and 165b is in contact with side surfaces and part of a top surface of the oxide semiconductor film 122a and side surfaces of the sidewall insulating films 161a and 161b. Therefore, regions of the pair of second regions 125a and 125b, which are in contact with the pair of electrodes 165a and 165b, serve as a source region and a drain region. Further, source-drain breakdown voltage can be increased with regions which are in contact with the gate insulating film 163a.

The transistor 160c having high field-effect mobility and large on-state current includes the insulating film 103 over the substrate 101, the oxide semiconductor film 122c over the insulating film 103, a pair of electrodes 165c and 165d which is in contact with the oxide semiconductor film 122c and serves as a source electrode and a drain electrode, a gate insulating film 163c covering part of the oxide semiconductor film 122c, the gate electrode 119c which is provided over the gate insulating film 163c and overlaps with the oxide semiconductor film 122c, and sidewall insulating films 161c and 161d which are provided on side surfaces of the gate electrode 119c. In the transistor 160c, the pair of electrodes 165c and 165d is in contact with side surfaces and part of a top surface of the oxide semiconductor film 122c and side surfaces of the sidewall insulating films 161c and 161d. Therefore, regions of the pair of second regions 125c and 125d, which are in contact with the pair of electrodes 165c and 165d, serve as a source region and a drain region. Further, source-drain breakdown voltage can be increased with regions which are in contact with the gate insulating film 163c.

Oxygen is added to the oxide semiconductor film 122a and oxygen is not added to the oxide semiconductor film 122c. In other words, the oxide semiconductor film 122a includes fewer oxygen defects than the oxide semiconductor film 122c.

It is preferable that the insulating film 127 covering the transistors 160a and 160c be formed.

The transistor 160a includes the sidewall insulating films 161a and 161b and the transistor 160c includes the sidewall insulating films 161c and 161d. The widths of the sidewall insulating films 161a to 161d can be controlled, so that high accuracy in alignment of a mask for forming the electrodes 165a to 165d is not strictly required. Accordingly, variation among plural transistors can be reduced.

Next, a method for manufacturing the transistors 160a and 160c in FIG. 9 will be described with reference to FIGS. 2A to 2D, FIGS. 5A to 5C, and FIGS. 10A to 10C. Note that in each of FIGS. 2A to 2D, FIGS. 5A to 5C, and FIGS. 10A to 10C, cross-section A-B illustrates a manufacturing step of cross section A-B in FIG. 9, and cross section C-D illustrates a manufacturing step of cross-section C-D in FIG. 9.

Through the steps illustrated in FIGS. 2A to 2C and FIGS. 5A and 5B, the insulating film 103 is formed over the substrate 101. Then, the oxide semiconductor films 122a and 122c are formed over the insulating film 103. Further, the gate insulating film 117 and the gate electrodes 119a and 119c are formed over the oxide semiconductor films 122a and 122c. Note that the oxide semiconductor films 122a and 122c are oxide semiconductor films which are subjected to heat treatment for dehydrogenation treatment.

Next, an insulating film to be the sidewall insulating films 161a to 161d is formed over the gate insulating film 117 and the gate electrodes 119a and 119c. The insulating film is formed by a sputtering method, a CVD method, or the like. There is no particular limitation on the thickness of the insulating film, and the thickness is determined as appropriate so that the insulating film can cover the gate electrodes 119a and 119c.

Then, the sidewall insulating films 161a to 161d are formed by etching the insulating film. The etching here is highly anisotropic etching, and the sidewall insulating films 161a to 161d can be formed in a self-aligned manner by performing the highly anisotropic etching on the insulating film. Here, dry etching is preferably employed as highly anisotropic etching, and a gas including fluorine such as trifluoromethane ($CHF_3$), octafluorocyclobutane ($C_4F_8$), or tetrafluoromethane ($CF_4$) can be used as an etching gas. A rare gas such as helium (He) or argon (Ar) or hydrogen ($H_2$) may be added to the etching gas. In addition, as the dry etching, a reactive ion etching (RIE) method in which high-frequency voltage is applied to a substrate is preferably used.

In the second regions 125a to 125d containing dopant, the distance between a channel and a source or a drain depends on the width of the sidewall insulating films 161a to 161d, and the width of the sidewall insulating films 161a to 161d depends on the thickness of the gate electrodes 119a and 119c. Therefore, the thickness of the gate electrodes 119a and 119c is determined so that the width of the sidewall insulating films 161a to 161d is in the desirable range.

Figure 10A:
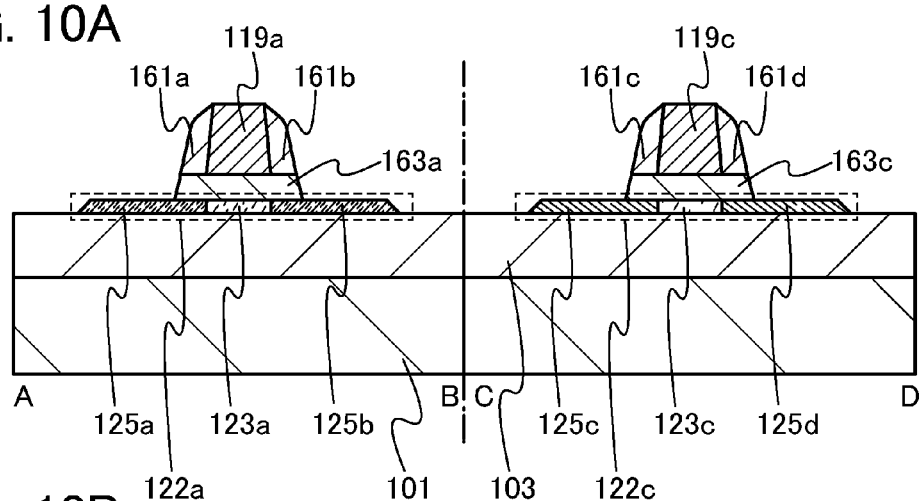
FIGS. 10A to 10C are cross-sectional views illustrating a method for manufacturing a semiconductor device according to an embodiment of the present invention.

In the step of forming the sidewall insulating films 161a to 161d, the gate insulating film 117 is etched by the highly anisotropic etching to expose the oxide semiconductor films 122a and 122c; thus, the gate insulating films 163a and 163c can be formed (see FIG. 10A).

Figure 10B:
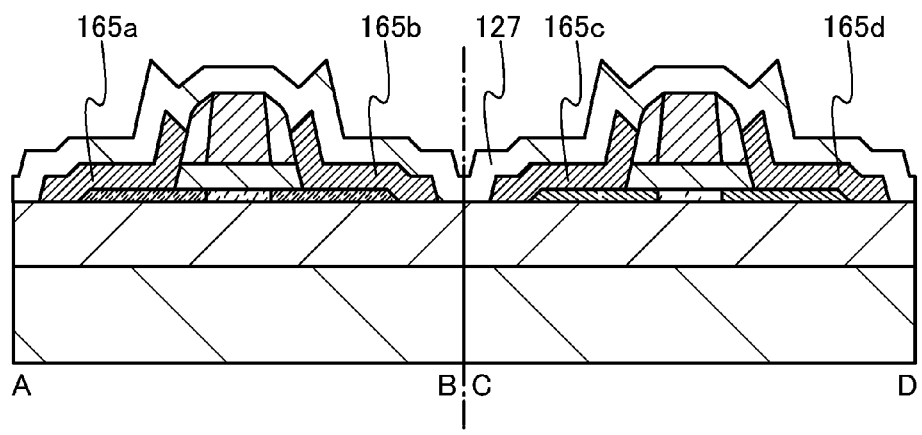

Next, as illustrated in FIG. 10B, the pair of electrodes 165a and 165b and the pair of electrodes 165c and 165d are formed.

The electrodes 165a to 165d can be formed in a manner similar to that of the electrodes 115a to 115d described in Embodiment 1. The electrodes 165a to 165d are preferably formed to be in contact with side surfaces of the sidewall insulating films 161a to 161d and side surfaces of the gate insulating films 163a and 163c. In other words, it is preferable that end portions of the electrodes 165a to 165d of the transistors be positioned over the sidewall insulating films 161a to 161d, and that exposed portions of the second regions 125a to 125d containing dopant in the oxide semiconductor films 122a and 122c be entirely covered with the electrodes 165a to 165d. Consequently, regions of the second regions 125a to 125d containing dopant, which are in contact with the electrodes 165a to 165d, function as a source region and a drain region. Further, source-drain breakdown voltage can be increased with regions overlapping with the sidewall insulating films 161a to 161d and the gate insulating films 163a and 163c. The distance between a channel and a source or a drain can be controlled by the length of the sidewall insulating films 161a to 161d, so that high accuracy in alignment of a mask for forming the electrodes 165a to 165d is not strictly required. Accordingly, variation among plural transistors can be reduced.

Next, the insulating film 127 may be formed over the gate electrodes 119a and 119c, the sidewall insulating films 161a to 161d, and the electrodes 165a to 165d.

Through the above-described steps, the transistors 160a and 160c illustrated in FIG. 9 can be manufactured.

Figure 10C:
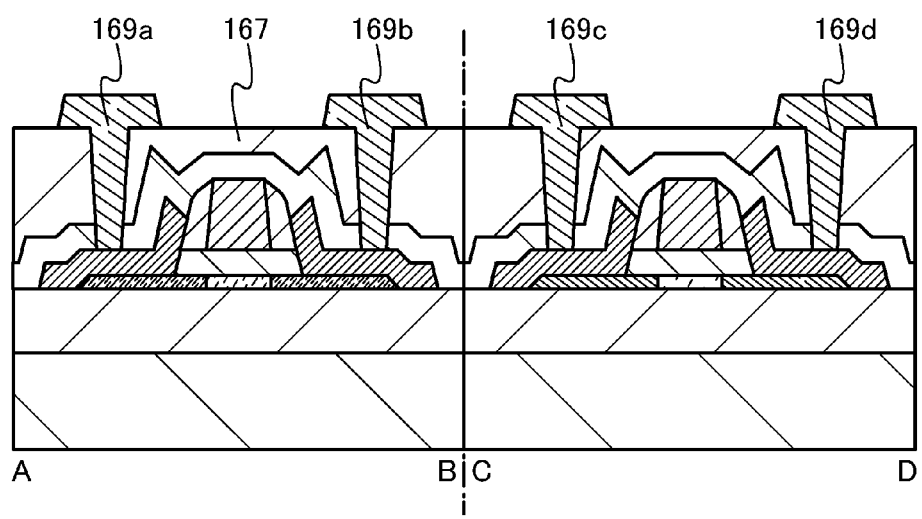

Note that as illustrated in FIG. 10C, the insulating film 167 is formed, and parts of the insulating film 127 and the insulating film 167 are etched to form opening portions. Then, a pair of electrodes 169a and 169b in contact with the pair of electrodes 165a and 165b through the opening portions and a pair of electrodes 169c and 169d in contact with the pair of electrodes 165c and 165d through the opening portions are formed. The electrodes 169a to 169d can be formed in a manner similar to that of the electrodes 115a to 115d.

According to this embodiment, oxygen is selectively added to an oxide semiconductor film after a dehydrogenation step, so that a transistor having small current at negative gate voltage and a transistor having high field-effect mobility and large on-state current can be manufactured over the same substrate.

(Embodiment 5)

In this embodiment, a transistor in which structures of an oxide semiconductor film, a pair of electrodes, and a gate electrode are different from those in Embodiments 1 and 3 will be described with reference to FIG. 11.

Figure 11:
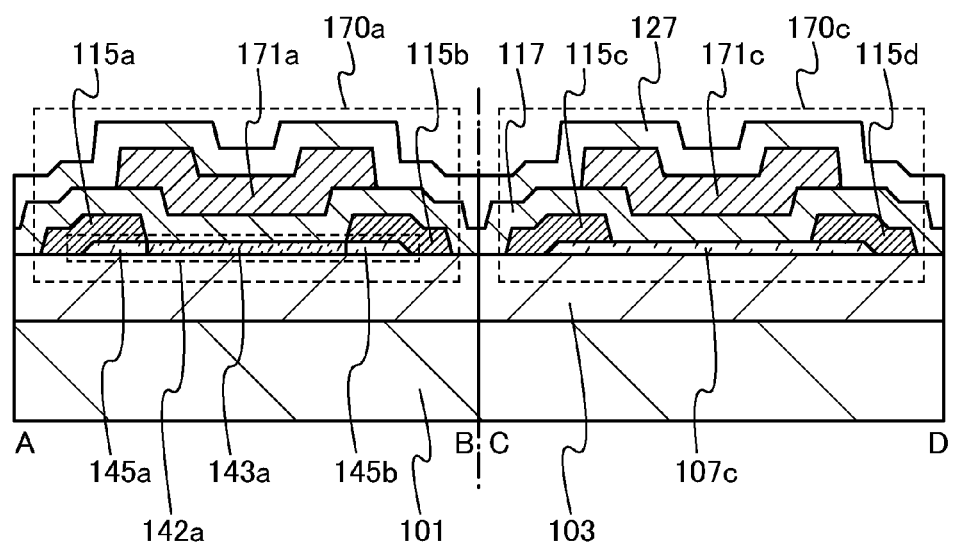
FIG. 11 is a cross-sectional view illustrating a semiconductor device according to an embodiment of the present invention.

FIG. 11 is a cross-sectional view of a semiconductor device described in this embodiment. The semiconductor device illustrated in FIG. 11 includes a transistor 170a having small current at negative gate voltage and a transistor 170c having high field-effect mobility and large on-state current.

The transistor 170a having small current at negative gate voltage includes the insulating film 103 over the substrate 101, an oxide semiconductor film 142a which is provided over the insulating film 103 and to which oxygen is added, the pair of electrodes 115a and 115b which is in contact with the oxide semiconductor film 142a and serves as a source electrode and a drain electrode, the gate insulating film 117 covering the oxide semiconductor film 142a, and a gate electrode 171a which is provided over the gate insulating film 117 and overlaps with part of the oxide semiconductor film 142a and part of the pair of electrodes 115a and 115b. Note that the oxide semiconductor film 142a includes the region 143a to which oxygen is added and the regions 145a and 145b to which oxygen is not added.

The transistor 170c having high field-effect mobility and large on-state current includes the insulating film 103 over the substrate 101, the oxide semiconductor film 107c which is provided over the insulating film 103, the pair of electrodes 115c and 115d which is in contact with the oxide semiconductor film 107c and serves as a source electrode and a drain electrode, the gate insulating film 117 covering the oxide semiconductor film 107c, and a gate electrode 171c which is provided over the gate insulating film 117 and overlaps with part of the oxide semiconductor film 107c and part of the pair of electrodes 115c and 115d.

It is preferable that the insulating film 127 covering the transistors 170a and 170c be formed.

Next, a method for manufacturing the transistors 170a and 170c illustrated in FIG. 11 will be described with reference to FIGS. 2A to 2D, FIGS. 7A to 7C, and FIGS. 12A and 12B.

Figure 12A:
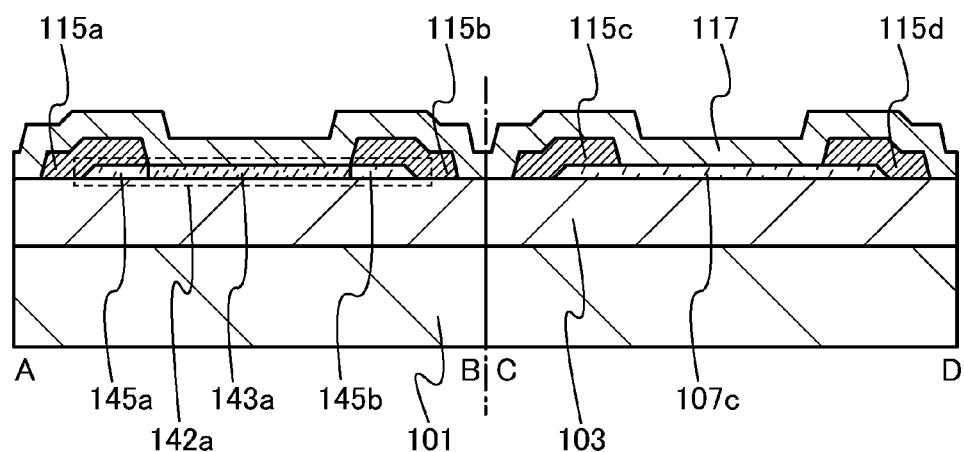
FIGS. 12A and 12B are cross-sectional views illustrating a method for manufacturing a semiconductor device according to an embodiment of the present invention.

Through the steps illustrated in FIGS. 2A and 2B and FIGS. 7A and 7B, the insulating film 103 is formed over the substrate 101 as illustrated in FIG. 12A. Then, the oxide semiconductor films 142a and 107c are formed over the insulating film 103. Note that the oxide semiconductor films 142a and 107c are oxide semiconductor films which are subjected to heat treatment for dehydrogenation treatment. The electrodes 115a to 115d are formed. Further, the gate insulating film 117 is formed. Note that the oxide semiconductor film 142a includes the region 143a to which oxygen is added and the regions 145a and 145b to which oxygen is not added. In other words, the region 143a includes fewer oxygen defects than the oxide semiconductor film 107c and the regions 145a and 145b.

Figure 12B:
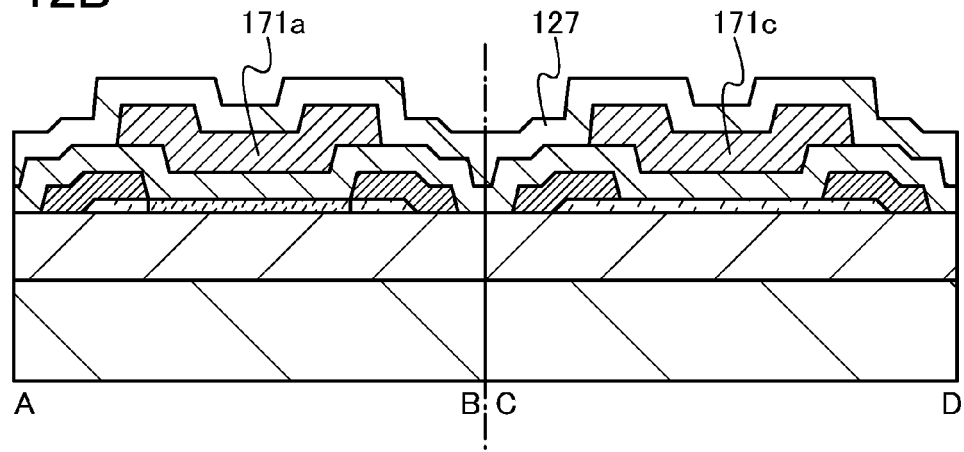

Subsequently, as shown in FIG. 12B, the gate electrodes 171a and 171c are formed over the gate insulating film 117. The gate electrodes 171a and 171c are formed in a manner similar to that of the gate electrodes 119a and 119c. Note that end portions of the gate electrode 171a are formed to overlap with parts of the pair of electrodes 115a and 115b and end portions of the gate electrode 171c are formed to overlap with parts of the electrodes 115c and 115d. After that, the insulating film 127 may be formed.

Through the above-described steps, the transistors 170a and 170c illustrated in FIG. 11 can be manufactured.

After that, in a manner similar to that in Embodiment 2, the insulating film 131 illustrated in FIG. 5C is formed over the insulating film 127. Next, parts of the gate insulating film 117, the insulating film 127, and the insulating film 131 are removed, so that opening portions are formed. Then, the electrodes 133a to 133d in contact with the electrodes 115a to 115d through the opening portions may be formed.

Although oxygen is added to the oxide semiconductor film 107a after the electrodes 115a to 115d are formed over the oxide semiconductor films 107a and 107c, oxygen may be added to the oxide semiconductor film 107a before the electrodes 115a to 115d are formed over the oxide semiconductor films 107a and 107c.

Since the gate electrode overlaps with part of the pair of electrodes in the transistor of this embodiment, an off-set region is not formed in the oxide semiconductor film, and regions of the oxide semiconductor film, which are in contact with the pair of electrodes, serve as a source region and a drain region without addition of dopant. For this reason, the number of steps can be reduced.

According to this embodiment, oxygen is selectively added to an oxide semiconductor film after a dehydrogenation step, so that a transistor having small current at negative gate voltage and a transistor having high field-effect mobility and large on-state current can be manufactured over the same substrate.

(Embodiment 6)

In this embodiment, a transistor in which a structure of a pair of electrodes is different from the structures described in Embodiments 1, 3, and 5 will be described.

In the transistors 120a and 120c of Embodiment 1, the electrodes 115a to 115d are provided between the gate insulating film 117 and the oxide semiconductor films 122a and 122c; in the transistors 150a and 150c of Embodiment 3, the electrodes 115a to 115d are provided between the gate insulating film 117 and the oxide semiconductor films 146a and 146c; and in the transistors 170a and 170c of Embodiment 5, the electrodes 115a to 115d are provided between the gate insulating film 117 and the oxide semiconductor films 142a and 107c. Instead of the structures, the electrodes may be provided between the insulating film 103 and the oxide semiconductor films 122a and 122c, between the insulating film 103 and the oxide semiconductor films 146a and 146c, or between the insulating film 103 and the oxide semiconductor films 142a and 107c.

(Embodiment 7)

In this embodiment, a transistor having a structure different from the structures of the transistors in Embodiments 1 to 6 and a manufacturing method of the transistor will be described with reference to FIG. 13 and FIGS. 14A to 14D. In this embodiment, an inverted staggered transistor having a bottom gate structure will be described.

Figure 13:
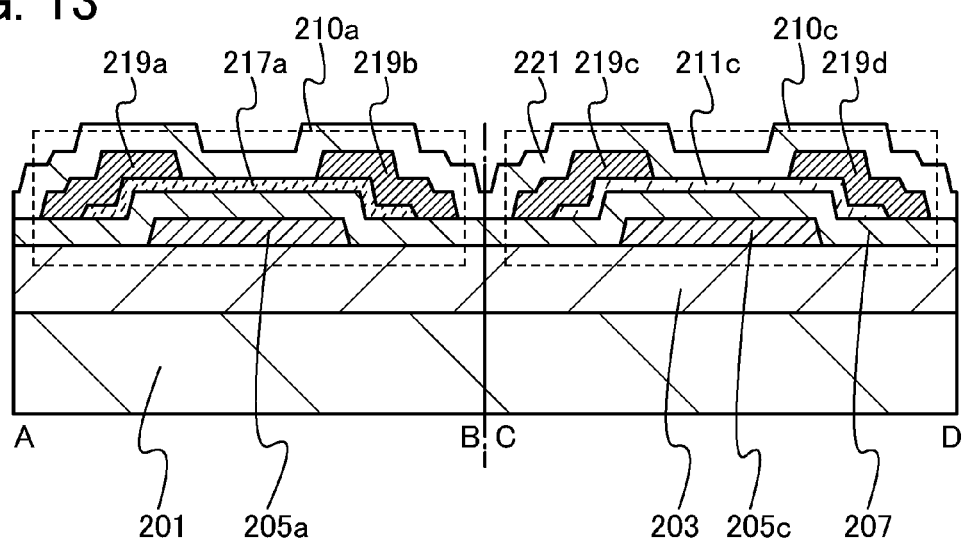
FIG. 13 is a cross-sectional view illustrating a semiconductor device according to an embodiment of the present invention.

FIG. 13 is a cross-sectional view of a semiconductor device described in this embodiment. The semiconductor device illustrated in FIG. 13 includes a transistor 210a having small current at negative gate voltage and a transistor 210c having high field-effect mobility and large on-state current.

The transistor 210a having small current at negative gate voltage includes an insulating film 203 over a substrate 201, a gate electrode 205a over the insulating film 203, a gate insulating film 207 covering the insulating film 203 and the gate electrode 205a, an oxide semiconductor film 217a which is provided over the gate insulating film 207 and overlaps with the gate electrode 205a, and a pair of electrodes 219a and 219b in contact with the oxide semiconductor film 217a.

The transistor 210c having high field-effect mobility and large on-state current includes the insulating film 203 over a substrate 201, a gate electrode 205c over the insulating film 203, the gate insulating film 207 covering the insulating film 203 and the gate electrode 205c, an oxide semiconductor film 211c which is provided over the gate insulating film 207 and overlaps with the gate electrode 205c, and a pair of electrodes 219c and 219d in contact with the oxide semiconductor film 211c.

An insulating film 221 covering the transistors 210a and 210c is preferably formed. Note that the insulating film 203 is not necessarily provided.

The substrate 101, the insulating film 103, the gate electrodes 119a and 119c, and the gate insulating film 117 in Embodiment 1 can be used for the substrate 201, the insulating film 203, the gate electrodes 205a and 205c, and the gate insulating film 207 as appropriate.

Like the first region 123a in the oxide semiconductor film 122a described in Embodiment 1, the oxide semiconductor film 217a is a region to which oxygen is added and includes fewer oxygen defects than the oxide semiconductor film 217c. In contrast, like the oxide semiconductor film 122c described in Embodiment 1, the oxide semiconductor film 217c is a region to which oxygen is not added.

The electrodes 219a to 219d can be formed in a manner similar to that of the electrodes 115a to 115d in Embodiment 1, and the insulating film 221 can be formed in a manner similar to that of the insulating film 127 in Embodiment 1.

Next, a method for manufacturing the transistors 210a and 210c in FIG. 13 will be described with reference to FIGS. 14A to 14D. Note that in each of FIGS. 14A to 14D, cross-section A-B illustrates a manufacturing step of cross section A-B in FIG. 13, and cross section C-D illustrates a manufacturing step of cross-section C-D in FIG. 13.

Figure 14A:
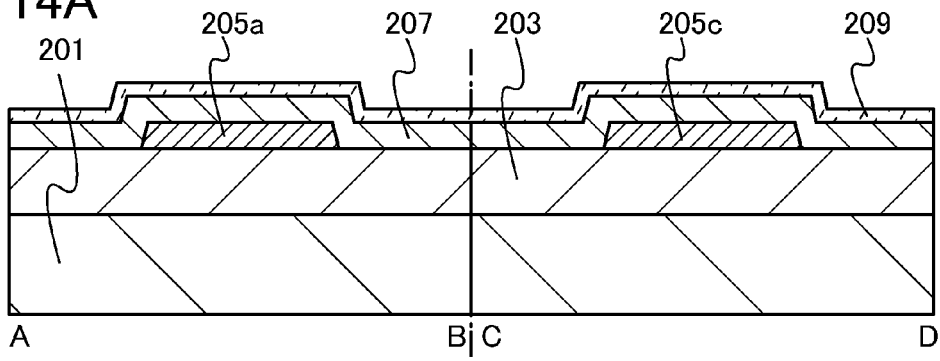
FIGS. 14A to 14D are cross-sectional views illustrating a method for manufacturing a semiconductor device according to an embodiment of the present invention.

As shown in FIG. 14A, the insulating film 203 is formed over the substrate 201. Then, the gate electrodes 205a and 205c are formed over the insulating film 203. The gate insulating film 207 is formed over the gate electrodes 205a and 205c. Then, the oxide semiconductor film 209 is formed over the gate insulating film 207.

The insulating film 203 can be formed in a manner similar to that of the insulating film 103 described in Embodiment 1.

The gate electrodes 205a and 205c can be formed in a manner similar to that of the gate electrodes 119a and 119c in Embodiment 1.

The gate insulating film 207 and the oxide semiconductor film 209 can be formed in a manner similar to that of the gate insulating film 117 in Embodiment 1 and in a manner similar to that of the oxide semiconductor film 105 in Embodiment 1, respectively. In other words, the oxide semiconductor film 209 is an oxide semiconductor film which is subjected to heat treatment for dehydrogenation treatment.

Figure 14B:
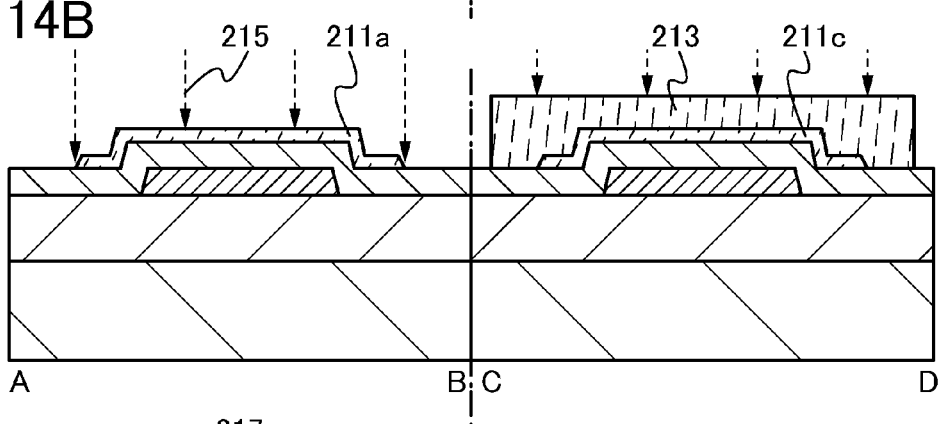
Figure 14C:
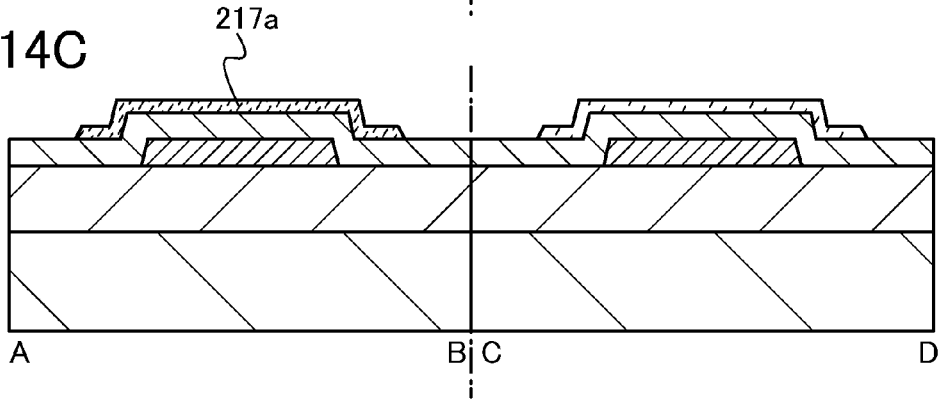

Next, as illustrated in FIG. 14B, the oxide semiconductor film 209 is selectively etched to form an oxide semiconductor film 211a and the oxide semiconductor film 211c. Then, after a mask 213 is formed over the oxide semiconductor film 211c which is part of the transistor having high field-effect mobility and large on-state current, oxygen 215 is added to the oxide semiconductor film 211a. Consequently, the oxide semiconductor film 217a in which oxygen defects are reduced as compared to those in the oxide semiconductor film 211c is formed (see FIG. 14C). After that, the mask 213 is removed. Addition of the oxygen 215 is performed similarly to the addition of the oxygen 111 in Embodiment 1.

Figure 14D:
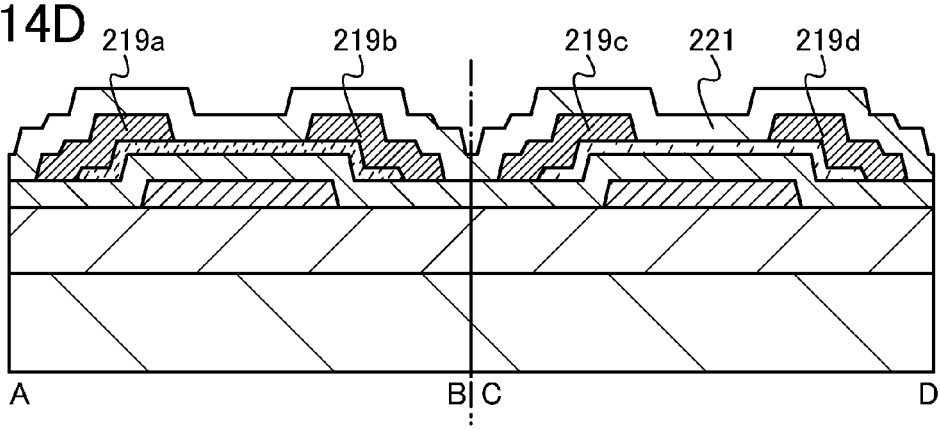

Next, as illustrated in FIG. 14D, the electrodes 219a to 219d are formed over the gate insulating film 207 and the oxide semiconductor films 217a and 211c. Next, the insulating film 221 is formed over the gate insulating film 207, the oxide semiconductor films 217a and 211c, and the electrodes 219a to 219d. The electrodes 219a to 219d are formed in a manner similar to that of the electrodes 115a to 115d in Embodiment 1. Further, the insulating film 221 is formed in a manner similar to that of the insulating film 127 in Embodiment 1.

When heat treatment is performed after that, the reliability of the transistors can be increased.

Through the above-described steps, the transistors 210a and 210c illustrated in FIG. 13 can be manufactured.

In the transistors 210a and 210c illustrated in FIG. 13, the pair of electrodes 219a and 219b is provided between the insulating film 221 and the oxide semiconductor film 217a and the pair of electrodes 219c and 219d is provided between the insulating film 221 and the oxide semiconductor film 211c. Instead of this structure, the pair of electrodes 219a and 219b may be provided between the gate insulating film 207 and the oxide semiconductor film 217a and the pair of electrodes 219c and 219d may be provided between the gate insulating film 207 and the oxide semiconductor film 211c.

According to this embodiment, oxygen is selectively added to an oxide semiconductor film after a dehydrogenation step, so that a transistor having small current at negative gate voltage and a transistor having high field-effect mobility and large on-state current can be manufactured over the same substrate.

(Embodiment 8)

In this embodiment, a transistor having a structure different from the structures of the transistors in Embodiments 1 to 7 and a method for manufacturing the transistor will be described with reference to FIG. 15, FIGS. 16A to 16D, and FIGS. 17A to 17C. In this embodiment, a semiconductor device including a coplanar transistor having a top gate structure and a staggered transistor having a dual gate structure is described.

Figure 15:
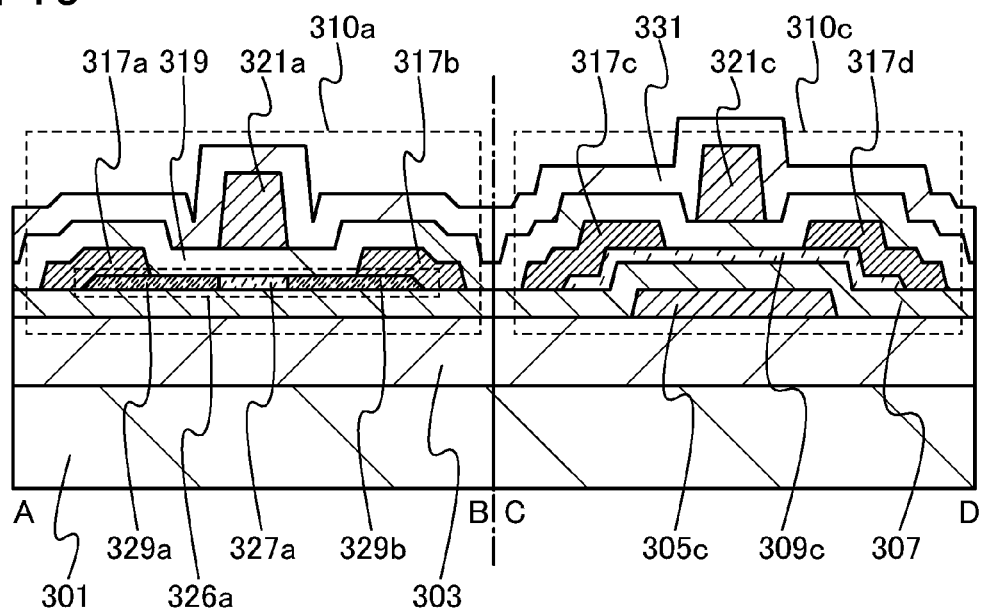
FIG. 15 is a cross-sectional view illustrating a semiconductor device according to an embodiment of the present invention.

FIG. 15 is a cross-sectional view of a semiconductor device described in this embodiment. The semiconductor device illustrated in FIG. 15 includes a transistor 310a having small current at negative gate voltage and a transistor 310c having high field-effect mobility and large on-state current.

The transistor 310a having small current at negative gate voltage has a single gate structure and is a coplanar transistor having a top gate structure. Note that any of the transistors 120a, 130a, 150a, 160a, 170a, and 210a having small current at negative gate voltage in Embodiments 1 to 7 can be used as the transistor 310a as appropriate. Here, a transistor having a structure similar to that of the transistor 120a in Embodiment 1 is described.

The transistor 310a having small current at negative gate voltage includes an insulating film 303 and an insulating film 307 over a substrate 301, an oxide semiconductor film 326a over the insulating film 307, a pair of electrodes 317a and 317b which is in contact with the oxide semiconductor film 326a and serves as a source electrode and a drain electrode, an insulating film 319 covering the oxide semiconductor film 326a, and a gate electrode 321a which is provided over the insulating film 319 and overlaps with the oxide semiconductor film 326a. The oxide semiconductor film 326a includes a first region 327a overlapping with the gate electrode 321a and a pair of second regions 329a and 329b between which the first region 327a is sandwiched and which contains dopant. The insulating film 319 serves as a gate insulating film. In the oxide semiconductor film 326a, the first region 327a serves as a channel region, and regions of the pair of second regions 329a and 329b containing dopant, which are in contact with the pair of electrodes 317a and 317b, serve as a source region and a drain region. With regions which are not in contact with the pair of electrodes 317a and 317b in the pair of second regions 329a and 329b, source-drain breakdown voltage can be increased.

The transistor 310c having high field-effect mobility and large on-state current has a dual gate structure. Note that as the transistor 310c, any of the transistors 120c, 130c, 150c, 160c, 170c, and 210c having high field-effect mobility and large on-state current in Embodiments 1 to 7 can be made to have a dual gate structure as appropriate. Here, the structure of the transistor 210a in Embodiment 7 is changed.

The transistor 310c having high field-effect mobility and large on-state current includes the insulating film 303 over the substrate 301, a first gate electrode 305c over the insulating film 303, the insulating film 307 covering the insulating film 303 and the first gate electrode 305c, an oxide semiconductor film 309c which is provided over the insulating film 307 and overlaps with the first gate electrode 305c, a pair of electrodes 317c and 317d in contact with the oxide semiconductor film 309c, the insulating film 319 covering the oxide semiconductor film 309c and the pair of electrodes 317c and 317d, and a second gate electrode 321c over the insulating film 319. The insulating film 307 serves as a first gate insulating film and the insulating film 319 serves as a second gate insulating film.

It is preferable that an insulating film 331 covering the transistors 310a and 310c be formed. Note that the insulating film 303 is not necessarily provided.

The substrate 301, the insulating film 303, the first gate electrode 305c, and the insulating film 307 can be formed in manners similar to those of the substrate 101, the insulating film 103, the gate electrode 119c, and the gate insulating film 117 in Embodiment 1.

Like the first region 123a in the oxide semiconductor film 122a in Embodiment 1, the oxide semiconductor film 326a is a region to which oxygen is added. Like the oxide semiconductor film 122c in Embodiment 1, the oxide semiconductor film 309c is a region to which oxygen is not added. Dopant is added to the pair of second regions 329a and 329b in the oxide semiconductor film 326a in a manner similar to that of the pair of second regions 125a and 125b in Embodiment 1.

The electrodes 317a to 317d, the insulating film 319, the gate electrode 321a, the second gate electrode 321c, and the insulating film 331 can be formed in manners similar to those of the electrodes 115a to 115d, the gate insulating film 117, the gate electrodes 119a and 119c, and the insulating film 127 in Embodiment 1.

Oxygen is added to the oxide semiconductor film 326a of the transistor 310a having small current at negative gate voltage, and the oxide semiconductor film 326a includes few oxygen defects. Therefore, the threshold voltage of the transistor 310a shifts in the positive direction and thus a normally-off transistor is obtained. On the other hand, since the transistor 310c having high field-effect mobility and large on-state current has a dual gate structure, the threshold voltage can be controlled by applying different voltages to the first gate electrode 305c and the second gate electrode 321c. In other words, the threshold voltage of a normally-off transistor whose threshold voltage shifts in the positive direction, and the threshold voltage of a normally-on transistor whose threshold voltage shifts in the negative direction can be set as appropriate in accordance with circuits of a semiconductor device.

Next, a method for manufacturing the transistors 310a and 310c in FIG. 15 will be described with reference to FIGS. 16A to 16D and FIGS. 17A to 17C. Note that in each of FIGS. 16A to 16D and FIGS. 17A to 17C, cross-section A-B illustrates a manufacturing step of cross section A-B in FIG. 15, and cross section C-D illustrates a manufacturing step of cross-section C-D in FIG. 15.

Figure 16A:
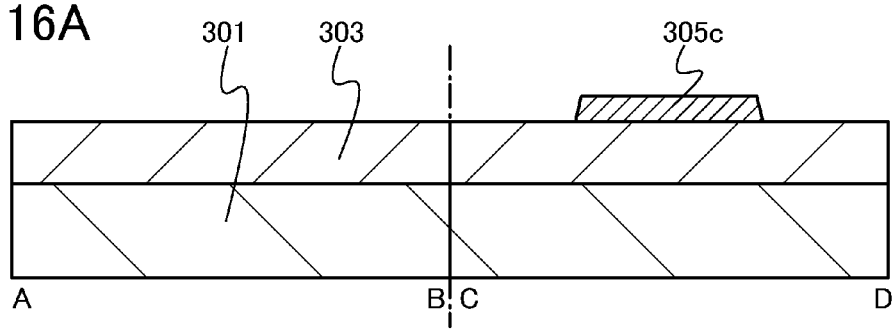
FIGS. 16A to 16D are cross-sectional views illustrating a method for manufacturing a semiconductor device according to an embodiment of the present invention.

As illustrated in FIG. 16A, the insulating film 303 is formed over the substrate 301. Then, the first gate electrode 305c is formed over the insulating film 303.

The insulating film 303 can be formed in a manner similar to that of the insulating film 103 described in Embodiment 1.

The first gate electrode 305c can be formed in a manner similar to that of the gate electrode 119c described in Embodiment 1.

Figure 16B:
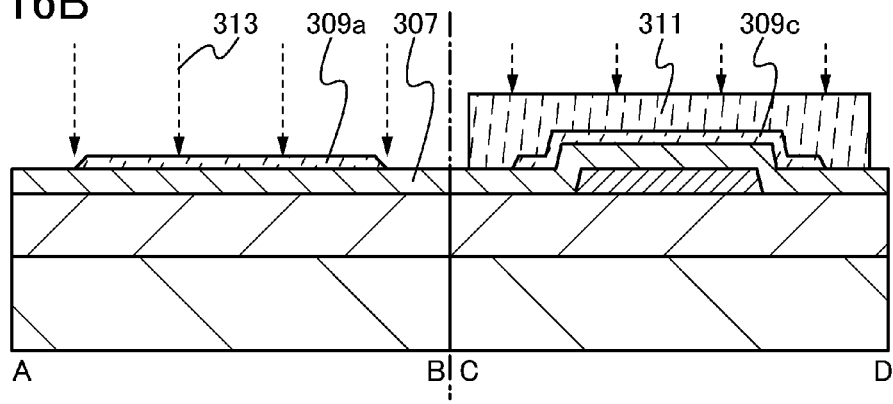
Figure 16C:
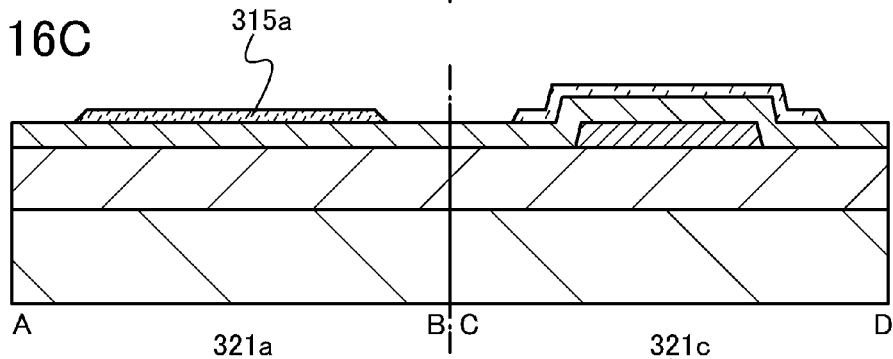

Next, as illustrated in FIG. 16B, the insulating film 307 is formed over the first gate electrode 305c. Then, an oxide semiconductor film 309a and the oxide semiconductor film 309c which are isolated from each other are formed over the insulating film 307.

The insulating film 307 and the oxide semiconductor films 309a and 309c can be formed in manners similar to those of the gate insulating film 117 and the oxide semiconductor films 107a and 107c in Embodiment 1.

Next, after a mask 311 is formed over the oxide semiconductor film 309c which is part of the transistor having high field-effect mobility and large on-state current, oxygen 313 is added to the oxide semiconductor film 309a. Consequently, an oxide semiconductor film 315a in which oxygen defects are reduced as compared to those in the oxide semiconductor film 309c is formed (see FIG. 16C). After that, the mask 311 is removed. Addition of the oxygen 313 is performed similarly to the addition of the oxygen 111 in Embodiment 1.

Figure 16D:
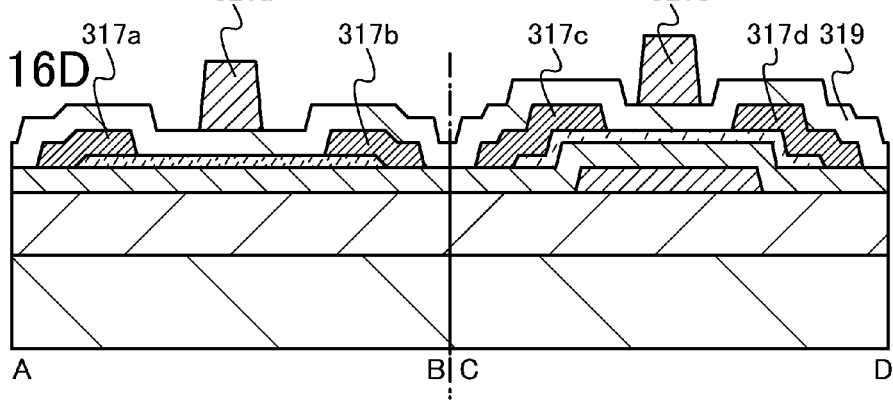

Next, as illustrated in FIG. 16D, the electrodes 317a to 317d are formed over the insulating film 307 and the oxide semiconductor films 315a and 309c. Next, the insulating film 319 is formed over the insulating film 307, the oxide semiconductor films 315a and 309c, and the electrodes 317a to 317d. The electrodes 317a to 317d are formed in a manner similar to that of the electrodes 115a to 115d in Embodiment 1. Further, the insulating film 319 is formed in a manner similar to that of the gate insulating film 117 in Embodiment 1.

Next, the gate electrode 321a overlapping with the oxide semiconductor film 315a and the second gate electrode 321c overlapping with the oxide semiconductor film 309c are formed over the insulating film 319. The gate electrode 321a and the second gate electrode 321c can be formed in a manner similar to that of the gate electrodes 119a and 119c in Embodiment 1.

Figure 17A:
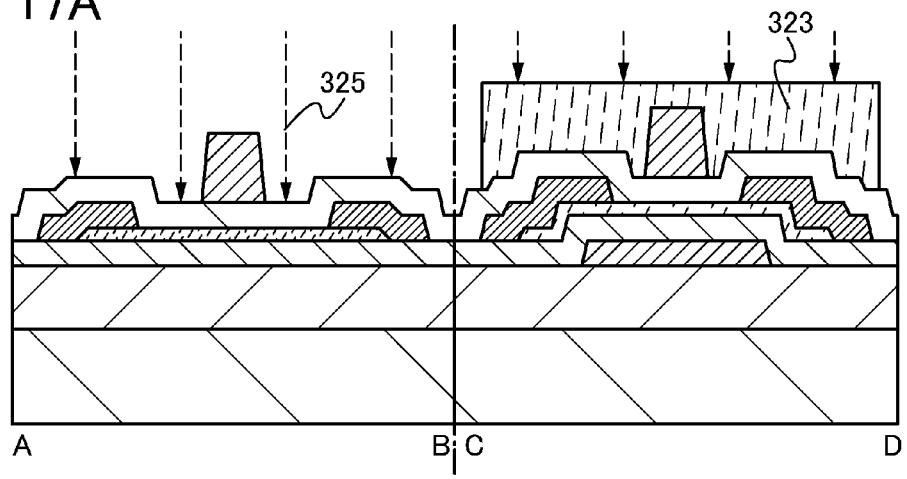
FIGS. 17A to 17C are cross-sectional views illustrating a method for manufacturing a semiconductor device according to an embodiment of the present invention.
Figure 17B:
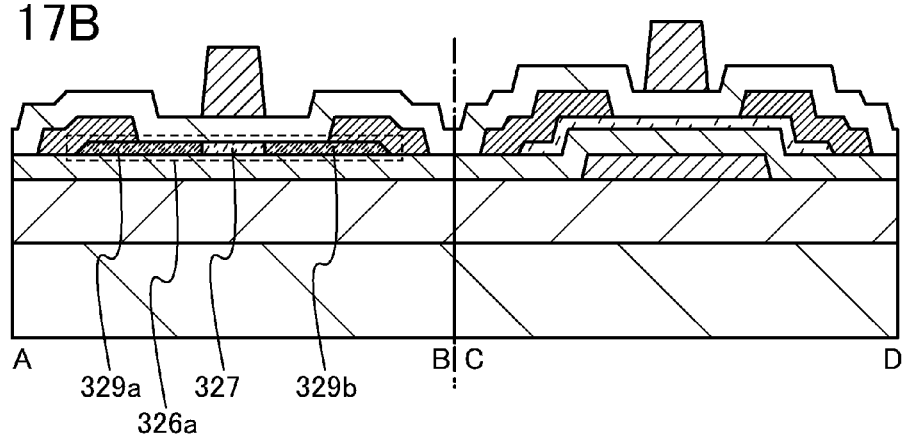

Next, as illustrated in FIG. 17A, a mask 323 is formed over the oxide semiconductor film 309c which is part of the transistor having high field-effect mobility and large on-state current, and then dopant 325 is added to the oxide semiconductor film 315a with the use of the gate electrode 321a as a mask. As a result, as illustrated in FIG. 17B, the pair of second regions 329a and 329b containing dopant is formed in cross-section A-B. Since the dopant is added with the use of the gate electrode 321a as a mask, the pair of second regions 329a and 329b containing dopant and the first region 327a to which the dopant is not added can be formed in a self-aligned manner. The oxide semiconductor film 326a includes the first region 327a and the pair of second regions 329a and 329b containing dopant.

After that, heat treatment may be performed.

Figure 17C:
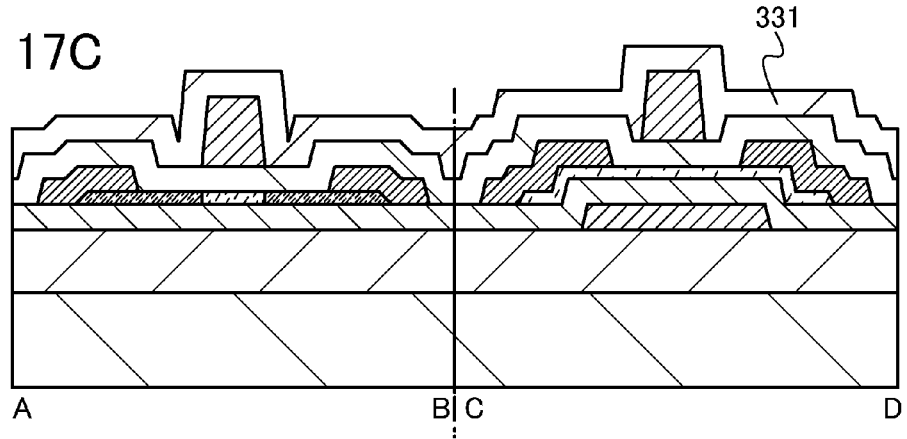

Next, as illustrated in FIG. 17C, the insulating film 331 is formed over the insulating film 319, the gate electrode 321a, and the second gate electrode 321c. After that, heat treatment is preferably performed.

Through the above-described steps, the transistors 310a and 310c illustrated in FIG. 15 can be manufactured.

According to this embodiment, oxygen is selectively added to an oxide semiconductor film after a dehydrogenation step, so that a transistor having small current at negative gate voltage and a transistor having high field-effect mobility and large on-state current can be manufactured over the same substrate.

(Embodiment 9)

In this embodiment, a memory device will be described as an example of the semiconductor devices in the above embodiments.

Figure 19:
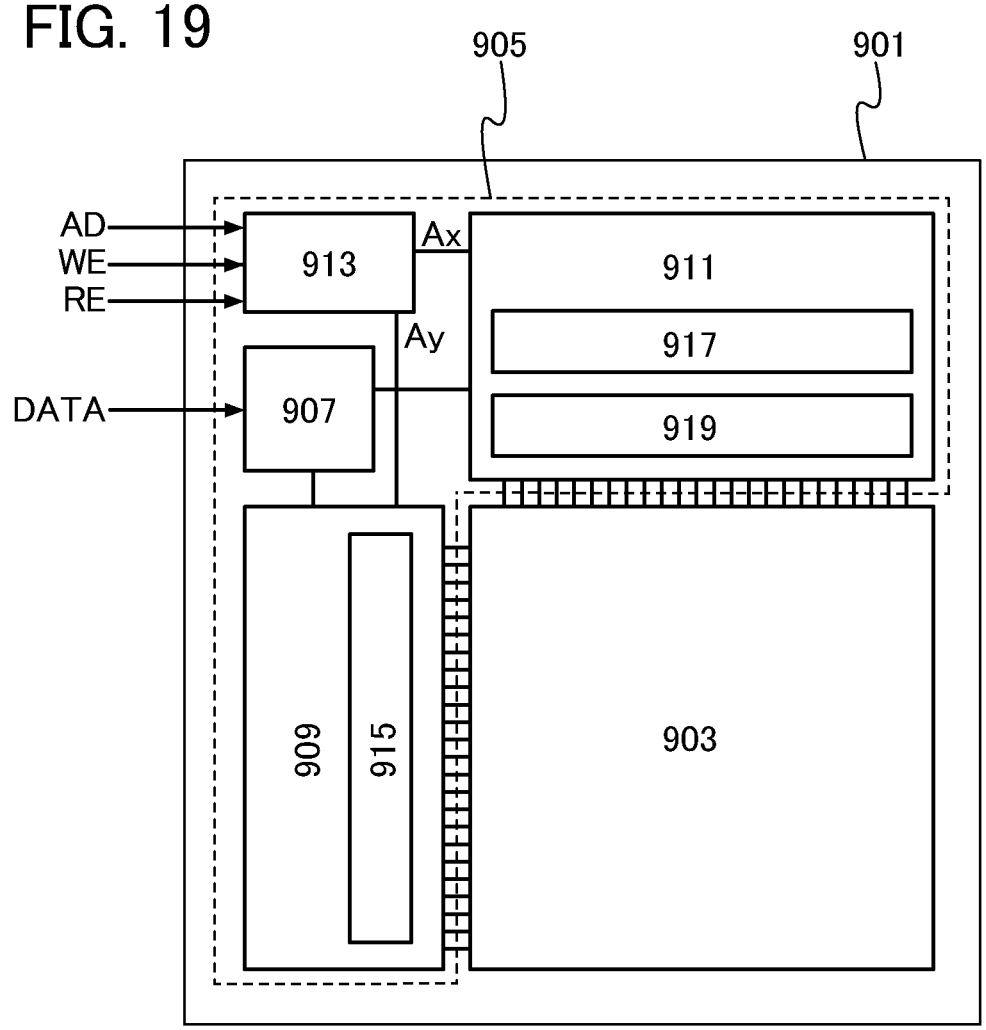
FIG. 19 is a block diagram illustrating a structure of a memory device according to an embodiment of the present invention.

FIG. 19 illustrates a block diagram of a specific structure of a memory device as an example. Note that in the block diagram in FIG. 19, circuits in the memory device are classified in accordance with their functions and separated blocks are illustrated. However, it is difficult to classify actual circuits according to their functions completely and it is possible for one circuit to have a plurality of functions.

A memory device 901 in FIG. 19 includes a memory cell array 903 and a driver circuit 905. The driver circuit 905 includes an input/output buffer 907; a word line driver circuit 909 configured to control the potential of a word line; a data line driver circuit 911 configured to control writing and reading of data to/from a memory cell; and a control circuit 913 configured to control operations of the input/output buffer 907, the word line driver circuit 909, and the data line driver circuit 911.

The word line driver circuit 909 includes a row decoder 915. In addition to the row decoder 915, the word line driver circuit 909 includes a level shifter and a buffer. The data line driver circuit 911 includes a column decoder 917 and a reading circuit 919. The data line driver circuit 911 includes a selector and a level shifter in addition to the column decoder 917 and the reading circuit 919.

Note that the memory cell array 903, the input/output buffer 907, the word line driver circuit 909, the data line driver circuit 911, and the control circuit 913 may be formed using one substrate; any one of them may be formed using a substrate different from a substrate for the others; or all of them may be formed using different substrates.

In the case of using different substrates, electrical connection can be ensured with the use of a flexible printed circuit (FPC) or the like. In that case, part of the driver circuit 905 may be connected to an FPC by a COF (chip on film) method. Further, electrical connection can be ensured by COG (chip on glass) method.

When a signal AD including an address Ax and an address Ay of the memory cell array 903 as data is input to the memory device 901, the control circuit 913 transmits the address Ax in the column direction and the address Ay in the row direction to the data line driver circuit 911 and the word line driver circuit 909, respectively. Further, the control circuit 913 transmits a signal DATA including data input to the memory device 901 through the input/output buffer 907, to the data line driver circuit 911.

Operation of writing data and operation of reading data in the memory cell array 903 is selected in accordance with a signal RE (read enable), a signal WE (write enable), or the like supplied to the control circuit 913. Further, in the case where the plurality of memory cell arrays 903 is provided, a signal CE (chip enable) for selecting the memory cell array 903 may be input to the control circuit 913. In that case, operation selected in accordance with the signal RE or the signal WE is performed in the memory cell array 903 selected in accordance with the signal CE.

In the memory cell array 903, when the writing operation is selected in accordance with the signal WE, a signal for selecting a memory cell corresponding to the address Ay is generated in the row decoder 915 included in the word line driver circuit 909 in response to an instruction from the control circuit 913. The amplitude of the signal is adjusted by the level shifter, and then the processed signal is input to the memory cell array 903 through the buffer. In the data line driver circuit 911, a signal for selecting a memory cell corresponding to the address Ax among the memory cells selected in the column decoder 917 is generated in response to an instruction from the control circuit 913. The amplitude of the signal is adjusted by the level shifter, and then the processed signal is input to the selector. In the selector, the signal DATA is sampled in accordance with the input signal, and the sampled signal is input to a memory cell corresponding to the address Ax and the address Ay.

In the memory cell array 903, when the reading operation is selected in accordance with the signal RE, a signal for selecting a memory cell corresponding to the address Ay is generated in the row decoder 915 included in the word line driver circuit 909 in response to an instruction from the control circuit 913. The amplitude of the signal is adjusted by the level shifter, and then the processed signal is input to the memory cell array 903 through the buffer. In the reading circuit 919, a memory cell corresponding to the address Ax is selected among the memory cells selected in the row decoder 915 in response to an instruction from the control circuit 913. Then, data stored in the memory cell corresponding to the addresses Ax and Ay is read, and a signal containing the data is generated.

Note that the data line driver circuit 911 may include a page buffer which can temporarily store the signal DATA, a precharge circuit which supplies a potential VR in advance to a data line in reading of data, or the like.

Figure 20:
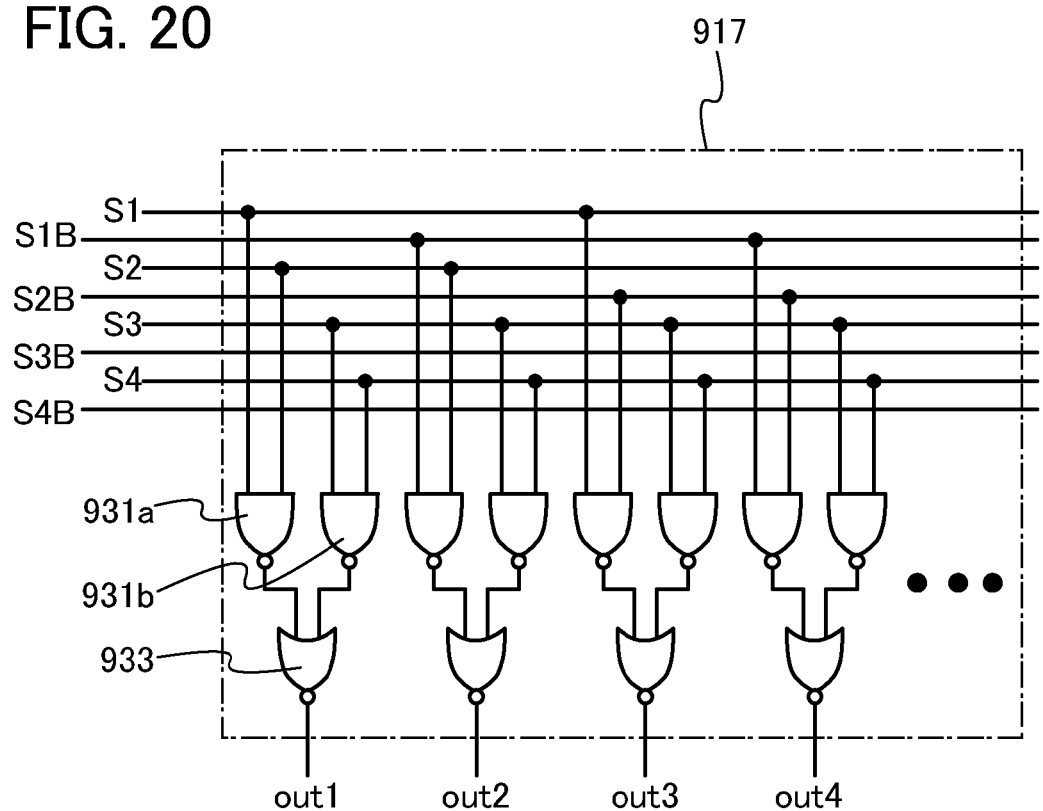
FIG. 20 is a circuit diagram illustrating a memory device according to an embodiment of the present invention.

Next, structures of the row decoder and the column decoder will be described with reference to FIG. 20. Here, description is made using the column decoder 917. As an example, the column decoder 917 of a 256-bit memory device including four bit lines and four word lines is described. Note that the number of bit lines and the number of word lines can be determined as appropriate in accordance with the number of bits.

In the column decoder 917, address signals are input to NAND circuits 931a and 931b from address lines S1, S1B, S2, S2B, S3, S3B, S4, and S4B. Note that inversion signals of the signals input to S1, S2, S3, and S4 are input to S1B, S2B, S3B, and S4B, respectively. Signals are output from the NAND circuits 931a and 931b to output terminals out1 to out16 (not illustrated) through NOR circuits 933. With the structure illustrated in FIG. 20, a signal for selecting a memory cell corresponding to the address Ax among the selected memory cells in the column decoder 917 is generated. The amplitude of the signal is adjusted by a level shifter, and then the processed signal is input to a selector. In the selector, the signal DATA is sampled in accordance with the input signal, and the sampled signal is input to a memory cell corresponding to the address Ax and the address Ay.

The row decoder 915 can have a circuit configuration similar to the column decoder 917 and a signal for selecting a memory cell corresponding to the address Ay is generated in the row decoder 915. The amplitude of the signal is adjusted by a level shifter, and then the processed signal is input to the memory cell array 903 through a buffer.

The driver circuit 905, the row decoder 915, and the column decoder 917 illustrated in FIG. 19 need to operate at high speed for writing signals to a bit line and a word line of the memory cell array 903. Therefore, high-speed operation of the memory device is possible with the use of a transistor having high field-effect mobility and large on-state current, such as the transistors 120c, 130c, 150c, 160c, 170c, 210c, and 310c in the above embodiments, in the driver circuit 905, the row decoder 915, and the column decoder 917.

Next, a structure of the memory cell array 903 will be described with reference to FIG. 21.

Figure 21:
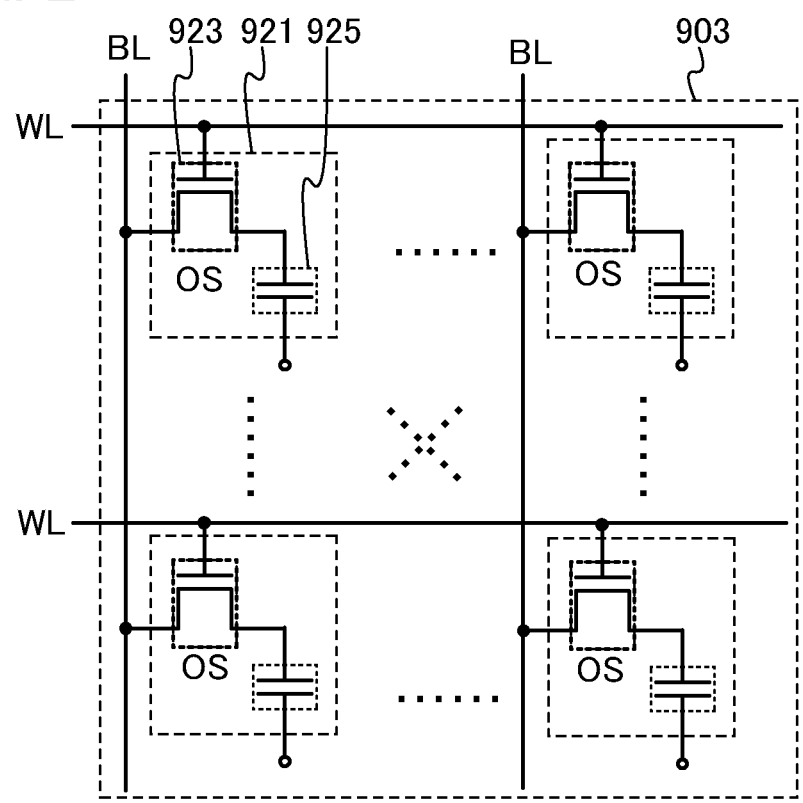
FIG. 21 is a circuit diagram illustrating a memory device according to an embodiment of the present invention.

FIG. 21 illustrates a memory cell array in a memory device whose structure corresponds to that of a so-called dynamic random access memory (DRAM). The memory cell array 903 in FIG. 21 includes m (m≥2) bit lines BL and n (n≥2) word lines WL. Further, m×n memory cells 921 are arranged in matrix.

Each of the memory cells 921 includes a transistor 923 and a capacitor 925. A gate electrode of the transistor 923 is connected to the word line WL. Further, one of a source electrode and a drain electrode of the transistor 923 is connected to the bit line BL. The other of the source electrode and the drain electrode of the transistor 923 is connected to one electrode of the capacitor 925. The other electrode of the capacitor 925 is connected to a capacitor line and is supplied with a predetermined potential.

Any of the transistors 120a, 130a, 150a, 160a, 170a, 210a, and 310a having small current at negative gate voltage in the above embodiments is used as the transistor 923 included in the memory cell 921 as appropriate, whereby data written to the capacitor 925 can be held for a long time and the memory device can be used as a substantially non-volatile memory device.

Although the semiconductor device having a structure corresponding to the DRAM is described with reference to FIG. 21, a memory element formed using any of the transistors 120a, 130a, 150a, 160a, 170a, 210a, and 310a having small current at negative gate voltage in the above embodiments can be used for a static random access memory (SRAM) and another memory device.

The structures, methods, and the like described in this embodiment can be combined as appropriate with any of the structures, methods, and the like described in the other embodiments.

(Embodiment 10)

In this embodiment, an example in which at least part of a driver circuit and a transistor provided in a pixel portion are formed over the same substrate in a display device which is one of semiconductor devices will be described below.

The transistor provided in the pixel portion has preferably small leakage current so that a potential of a pixel electrode included in the pixel is kept. Therefore, any of the transistors 120a, 130a, 150a, 160a, 170a, 210a, and 310a having small current at negative gate voltage in the above embodiments is used as the transistor provided in the pixel portion as appropriate. Further, the part of the driver circuit which can be formed using an n-channel TFT is formed using any of the transistors 120c, 130c, 150c, 160c, 170c, 210c, and 310c having high field-effect mobility and large on-state current in the above embodiments as appropriate and is formed over the same substrate as the transistor in the pixel portion. The transistors described in the above embodiments are used for the pixel portion and the driver circuit as described above, whereby a highly reliable display device which can operate at high speed and consumes a small amount of power can be provided.

Figure 22:
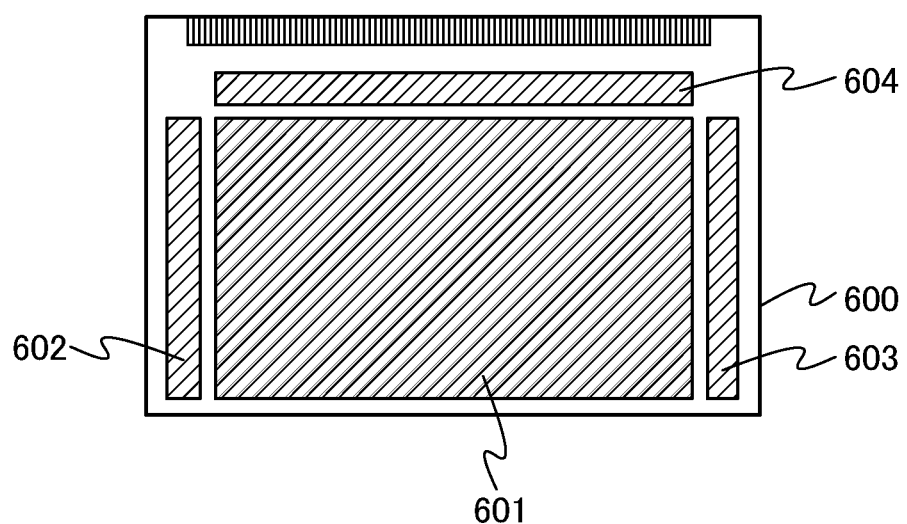
FIG. 22 illustrates an active matrix display device according to an embodiment of the present invention.

FIG. 22 illustrates an example of an active matrix display device. A pixel portion 601, a first scan line driver circuit 602, a second scan line driver circuit 603, and a signal line driver circuit 604 are provided over a substrate 600 in the display device. In the pixel portion 601, a plurality of signal lines extended from the signal line driver circuit 604 is arranged and a plurality of scan lines extended from the first scan line driver circuit 602 and the second scan line driver circuit 603 is arranged. Note that pixels which include display elements are provided in matrix in respective regions where the scan lines and the signal lines intersect with each other. The substrate 600 of the display device is connected to a timing control circuit (also referred to as controller or control IC) through a connection portion such as a flexible printed circuit (FPC).

In FIG. 22, the first scan line driver circuit 602, the second scan line driver circuit 603, and the signal line driver circuit 604 are formed over the substrate 600 where the pixel portion 601 is formed. Accordingly, the number of components of a driver circuit which is provided outside and the like is reduced, so that cost reduction can be achieved. Further, if the driver circuit is provided outside the substrate 600, wirings would need to be extended and the number of connections of wirings would be increased, but by providing the driver circuit over the substrate 600, the number of connections of the wirings can be reduced. Accordingly, the reliability or yield can be improved.

The method, structure, and the like described in this embodiment can be combined as appropriate with any of the methods, structures, and the like described in the other embodiments.

(Embodiment 11)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone (also referred to as a cellular phone or a cellular phone device), a portable game machine, a portable information terminal, an audio reproducing device, a large-sized game machine such as a pachinko machine, and the like. An example of an electronic device including the semiconductor device described in the above embodiment will be described.

Figure 23:
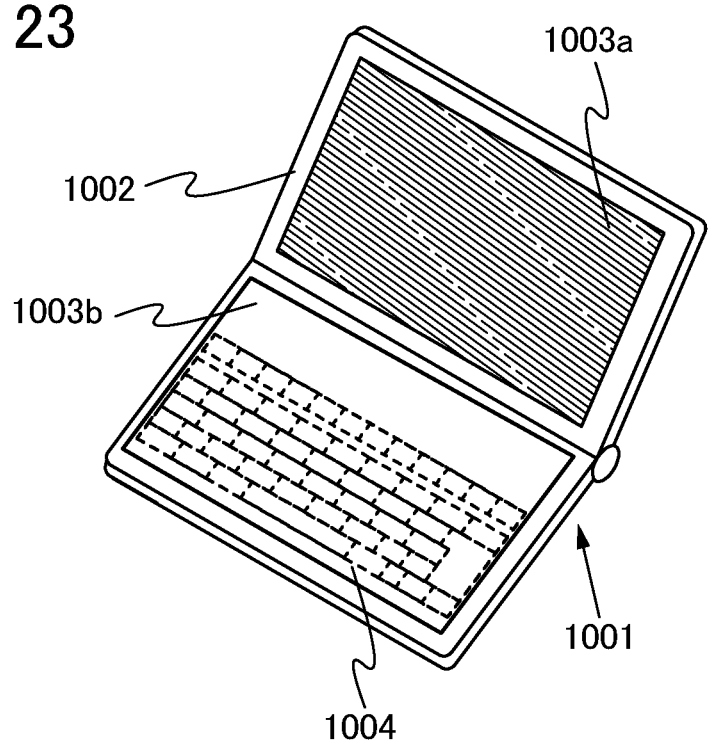
FIG. 23 is an external view of an electronic device according to an embodiment of the present invention.

FIG. 23 illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is manufactured by using the transistor described in any of the above embodiments as a switching element and applied to the display portion 1003a or 1003b, whereby the reliability of the display portion of the portable information terminal can be improved.

The portable information terminal in FIG. 23 can have a function of displaying a variety of information (e.g., a still image, a moving image, and a text image) on the display portion, a function of displaying a calendar, a date, the time, or the like on the display portion, a function of operating or editing information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 23 may transmit and receive data wirelessly. Through wireless communication, desired book data or the like can be purchased and downloaded from an electronic book server.

The method, structure, and the like described in this embodiment can be combined as appropriate with any of the methods, structures, and the like described in the other embodiments.

EXAMPLE 1

In this example, electric characteristics of a transistor including an oxide semiconductor film to which oxygen is added (hereinafter referred to as a transistor 1) and a transistor including an oxide semiconductor film to which oxygen is not added (hereinafter referred to as a transistor 2) will be described with reference to FIGS. 2A to 2D, FIGS. 7A to 7C, FIGS. 12A and 12B, FIGS. 17A to 17C, and FIGS. 18A and 18B. The transistors described in Embodiment 5 were manufactured in this example.

First, steps of manufacturing the transistor 1 and the transistor 2 are described.

The insulating film 103 was formed over the substrate 101 as illustrated in FIG. 2A.

A silicon wafer was used as the substrate 101.

The substrate 101 was heated at 950° C. in an oxygen atmosphere including hydrogen chloride, so that a 100-nm-thick silicon oxide film including chlorine was formed on the substrate 101. Then, the silicon oxide film including chlorine on one surface of the substrate 101 was removed. Next, the opposite surface of the substrate 101, i.e., a surface of the silicon oxide film including chlorine, was subjected to reverse sputtering treatment, and a silicon oxide film having a thickness of 330 nm was formed over the silicon oxide film including chlorine by a sputtering method. As for sputtering conditions at this time, a silicon oxide target was used; oxygen was introduced as a sputtering gas at 50 sccm into a chamber having a pressure of 0.4 Pa; the substrate temperature was 100° C.; the distance between the substrate and the target was 60 mm; and the supplied electric power was 1.5 kW. Through the above steps, the insulating film 103 was formed over the substrate 101.

Next, planarization treatment was performed on a surface of the insulating film 103. Here, the surface of the insulating film 103 was polished by 30 nm by CMP treatment.

Next, an In—Sn—Zn-based oxide film having a thickness of 15 nm was formed by a sputtering method. Then, oxygen was diffused from the insulating film 103 to the In—Sn—Zn-based oxide film by heat treatment. Thus, the oxide semiconductor film 105 in which oxygen defects were reduced was formed. However, oxygen defects still remain in the oxide semiconductor film 105 even after the heat treatment. As for sputtering conditions at this time, a target of In:Sn:Zn=1:1:1 was used; oxygen was introduced as a sputtering gas at a flow rate of 15 sccm into a chamber having a pressure of 0.4 Pa; the substrate temperature was 200° C.; and the supplied electric power was 0.1 kW. The heat treatment was performed in a nitrogen atmosphere in a chamber at 250° C. and then in an oxygen atmosphere.

Next, a mask was formed over the oxide semiconductor film 105 in a photolithography step and then the oxide semiconductor film 105 was selectively etched; thus, as illustrated in FIG. 2B, the oxide semiconductor films 107a and 107c were formed. Here, an ICP etching apparatus was used for the etching. As for etching conditions, a power of 450 W was supplied to an ICP electrode; a power of 100 W was supplied to a bias electrode; the chamber pressure was 1.9 Pa; and boron trichloride at a flow rate of 60 sccm and chlorine at a flow rate of 20 sccm were used as etching gases.

Next, as illustrated in FIG. 7A, the pair of electrodes 115a and 115b was formed over the oxide semiconductor film 107a and the pair of electrodes 115c and 115d was formed over the oxide semiconductor film 107c. Here, the electrodes 115a to 115d were formed in such a manner that a tungsten film having a thickness of 100 nm was formed over the oxide semiconductor films 107a and 107c by a sputtering method, a mask was formed over the tungsten film in a photolithography step, and then the tungsten film was selectively etched. After that, the mask was removed.

As for sputtering conditions for forming the tungsten film, a tungsten target was used; heated argon was introduced as a sputtering gas at a flow rate of 80 sccm into a chamber having a pressure of 0.8 Pa; the substrate temperature was 230° C.; and the supplied electric power was 1 kW.

As for etching conditions for etching the tungsten film, a power of 500 W was supplied to an ICP electrode; a power of 150 W was supplied to a bias electrode; a chamber pressure was 1.0 Pa; and carbon tetrachloride at a flow rate of 25 sccm, chlorine at a flow rate of 25 sccm, and oxygen at a flow rate of 10 sccm were used as etching gases.

Next, the gate insulating film 117 was formed over the oxide semiconductor films 107a and 107c and the electrodes 115a to 115d. Here, as the gate insulating film 117, a silicon oxynitride film having a thickness of 100 nm was formed by a CVD method. As for deposition conditions by a plasma CVD method at this time, silane at a flow rate of 1 sccm and dinitrogen monoxide at a flow rate of 800 sccm were introduced as source gases into a chamber having a pressure of 40 Pa; the power of 60 MHz high-frequency power supply was 150 W; the substrate temperature was 400° C.; and the distance between electrodes was 28 mm.

Next, as illustrated in FIG. 7B, the mask 109 was formed in a photolithography step, and then oxygen is added to the oxide semiconductor film 107a included in the transistor 1. Here, an ion implantation apparatus was used, and the electron energy was set to 25 kV and the dose of oxygen was set to $1\times10^{15}$ cm$^{-2}$. Note that oxygen was not added to the oxide semiconductor film 107c included in the transistor 2. As a result, as illustrated in FIG. 12A, the region 143a to which oxygen was added and the pair of regions 145a and 145b which overlapped with the pair of electrodes 115a and 115b and to which oxygen was not added were formed in the oxide semiconductor film 142a in the transistor 1.

Next, as illustrated in FIG. 12B, the gate electrodes 171a and 171c were formed over the gate insulating film 117, and then the insulating film 127 was formed.

The gate electrodes 171a and 171c were formed in such a manner that a tantalum nitride film having a thickness of 30 nm and a tungsten film having a thickness of 135 nm were stacked over the gate insulating film 117 by a sputtering method, a mask was formed over the tungsten film in a photolithography step, and then the tantalum nitride film and the tungsten film were selectively etched.

As for sputtering conditions for forming the tantalum nitride film, a tantalum nitride target was used; argon at a flow rate of 50 sccm and nitrogen at a flow rate of 10 sccm were introduced as sputtering gases into a chamber having a pressure of 0.6 Pa; and the supplied electric power was 1 kW. As for sputtering conditions for forming the tungsten film, a tungsten target was used; heated argon at a flow rate of 100 sccm was introduced as a sputtering gas into a chamber having a pressure of 2 Pa; the substrate temperature was 230° C.; and the supplied electric power was 4 kW.

As for etching conditions of the tungsten film, a power of 3000 W was supplied to an ICP electrode; a power of 110 W was supplied to a bias electrode; the chamber pressure was 0.67 Pa; and chlorine at a flow rate of 45 sccm, tetrafluoromethane at a flow rate of 55 sccm, and oxygen at a flow rate of 55 sccm were used as etching gases. As for etching of the tantalum nitride film, first etching was performed under the conditions that a power of 2000 W was supplied to an ICP electrode; a power of 50 W was supplied to a bias electrode; the chamber pressure was 1 Pa; and chlorine at a flow rate of 100 sccm was used as an etching gas, and then second etching was performed under the conditions that a power of 1000 W was supplied to the ICP electrode; a power of 25 W was supplied to the bias electrode; and the chamber pressure was changed to 2 Pa.

As the insulating film 127, a stack of an aluminum oxide film having a thickness of 50 nm and a silicon oxynitride film having a thickness of 300 nm was formed.

As for sputtering conditions for forming the aluminum oxide film, an aluminum oxide target was used; argon at a flow rate of 25 sccm and oxygen at a flow rate of 25 sccm were introduced as sputtering gases into a chamber having a pressure of 0.4 Pa; the distance between the target and the substrate was 60 mm; the substrate temperature was 250° C.; and the supplied electric power was 2.5 kW. As for deposition conditions of the silicon oxynitride film by a plasma CVD method, silane at a flow rate of 5 sccm and dinitrogen monoxide at a flow rate of 1000 sccm were introduced as source gases into a chamber having a pressure of 133 Pa; the power of a 13.56 MHz high-frequency power supply was 35 W; the substrate temperature was 325° C.; and the distance between electrodes was 20 mm.

After that, a mask was formed over the insulating film 127 in a photolithography step, and the gate insulating film 117 and the insulating film 127 were selectively etched; thus, openings were formed. Then, a pair of electrodes was formed in the opening portions.

As for etching conditions of the gate insulating film 117 and the insulating film 127, a power of 475 W was supplied to an ICP electrode; a power of 300 W was supplied to a bias electrode; the chamber pressure was 3.5 Pa; and trifluoromethane at a flow rate of 22.5 sccm, helium at a flow rate of 127.5 sccm, and methane at a flow rate of 5 sccm were used as etching gases.

The pair of electrodes was formed in such a manner that a titanium film having a thickness of 50 nm, an aluminum film having a thickness of 100 nm, and a titanium film having a thickness of 50 nm were stacked in this order, a mask was formed in a photolithography step, and the films were selectively etched with the use of the mask.

As for sputtering conditions for forming the titanium films, a titanium target was used; argon at a flow rate of 20 sccm was introduced as a sputtering gas into a chamber having a pressure of 0.1 Pa; the substrate temperature was room temperature; and the supplied electric power was 12 kW. As for sputtering conditions for forming the aluminum film, an aluminum target was used; argon at a flow rate of 50 sccm was introduced as a sputtering gas into a chamber having a pressure of 0.4 Pa; the substrate temperature was room temperature; and the supplied electric power was 1 kW.

As for etching conditions of the titanium film, the aluminum film, and the titanium film, a power of 450 W was supplied to an ICP electrode; a power of 100 W was supplied to a bias electrode; the chamber pressure was 1.9 Pa; and boron trichloride at a flow rate of 60 sccm and chlorine at a flow rate of 20 sccm were used as etching gases.

Through the above steps, the transistor 1 and the transistor 2 were fabricated.

Figure 18A:
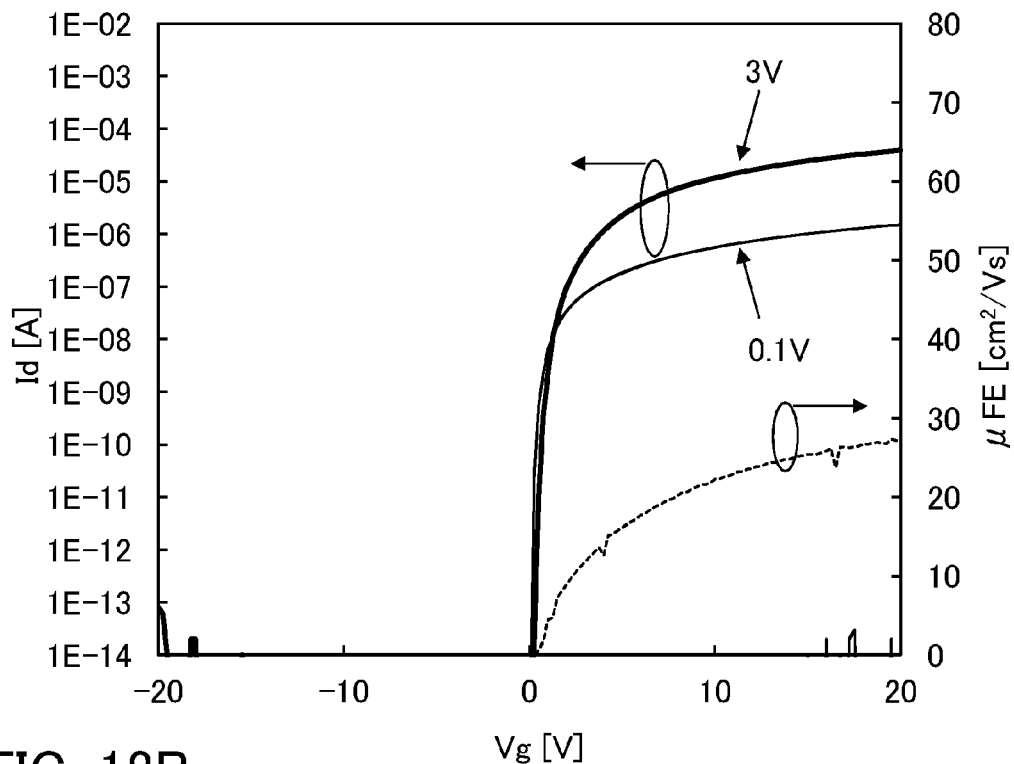
FIGS. 18A and 18B are each a graph showing electric characteristics of a transistor according to an embodiment of the present invention.
Figure 18B:
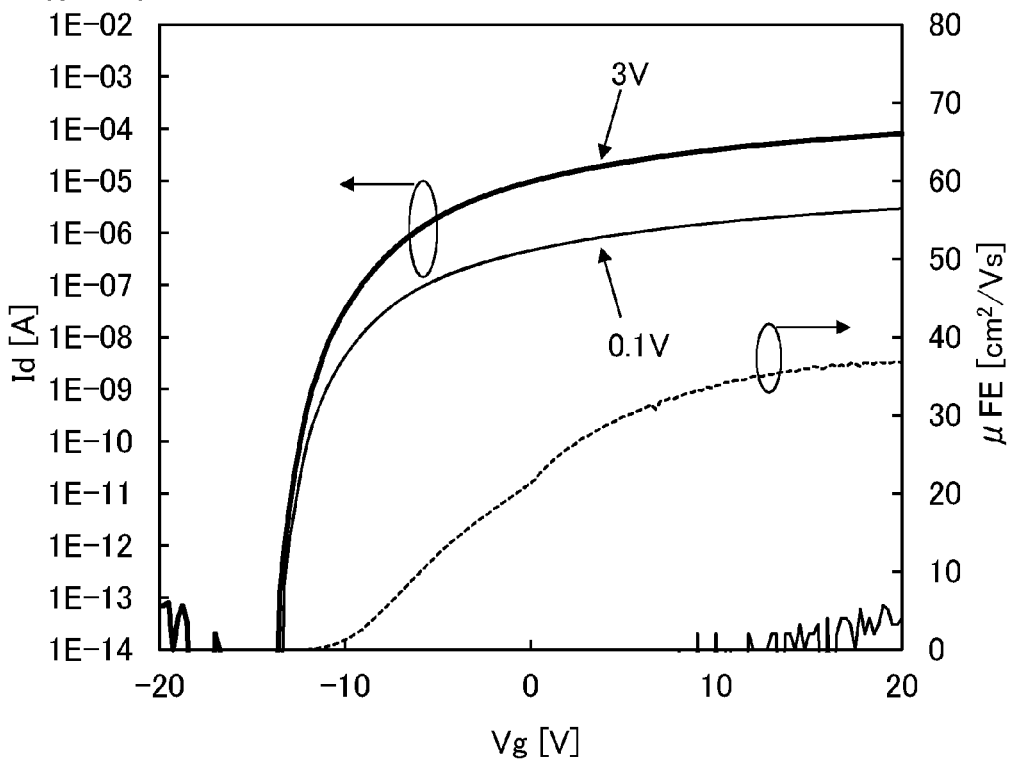

FIG. 18A shows electric characteristics of the transistor 1 and FIG. 18B shows electric characteristics of the transistor 2. In FIGS. 18A and 18B, the left vertical axis indicates drain current, the right vertical axis indicates field-effect mobility, and the horizontal axis indicates gate voltage.

In the thin film transistors of this example, the gap between the pair of facing electrodes 115a and 115b and the gap between the pair of facing electrodes 115c and 115d (i.e., the distance between a pair of electrodes in the channel length direction) were each 9.9 μm, and the width of the facing portions of the pair of electrodes 115a and 115b and the width of the facing portions of the pair of electrodes 115c and 115d (i.e., the length of facing portions of a pair of electrodes in the channel width direction) were each 10.3 μm. The field-effect mobility was calculated on the assumption that the thickness of the gate insulating film 117 was 100 nm and the average permittivity was 4.1.

Table 1 shows on-state current ($Ion\_0.1$) at a drain voltage (Vd) of 0.1 V and a gate voltage (Vg) of 3 V; on-state current ($Ion\_3$) at a drain voltage (Vd) of 3 V and a gate voltage (Vg) of 3 V; current ($Ioff\_0.1$) at a drain voltage (Vd) of 0.1 V and a gate voltage (Vg) of −3 V; current ($Ioff\_3$) at a drain voltage (Vd) of 3 V and a gate voltage (Vg) of −3 V; the threshold voltage (Vth); field-effect mobility ($\mu FE\_lin$) at a drain voltage (Vd) of 0.1 V; and field-effect mobility ($\mu FE\_sat$) at a drain voltage (Vd) of 3 V.

TABLE 1

| | | | Transistor 1 | Transistor 2 |
|---|---|---|---|---|
| Ion_0.1[A] | (Vd = 0.1 V) | (Vg = 3 V) | 7.5E−08 | 7.3E−07 |
| Ion_3[A] | (Vd = 3 V) | (Vg = 3 V) | 4.4E−07 | 1.7E−05 |
| Ioff_0.1[A] | (Vd = 0.1 V) | (Vg = −3 V) | 1.0E−16 | 2.4E−07 |
| Ioff_3[A] | (Vd = 3 V) | (Vg = −3 V) | 1.0E−16 | 4.3E−06 |
| Vth[V] | (Vd = 3 V) | | 1.5E+00 | −9.0E+00 |
| μFE_lin[cm²/Vs] | (Vd = 0.1 V) | (max) | 2.7E+01 | 3.7E+01 |
| μFE_sat[cm²/Vs] | (Vd = 3 V) | (max) | 1.0E+01 | 6.3E+00 |

It is found from FIGS. 18A and 18B and Table 1 that the transistor including the oxide semiconductor film to which oxygen is added (transistor 1) has small current at a gate voltage of lower than or equal to 0 V. Further, it is also found that the threshold voltage is positive. In other words, the transistor 1 is a normally-off transistor. On the other hand, it is found that the on-state current is large and the field-effect mobility (except Vd=3 V) is high in the transistor including the oxide semiconductor film to which oxygen is not added (transistor 2) as compared to the transistor 1.

This application is based on Japanese Patent Application serial no. 2011-161222 filed with Japan Patent Office on Jul. 22, 2011, the entire contents of which are hereby incorporated by reference.

What is claimed is:

1. A semiconductor device comprising:
   a first transistor comprising:
      a first oxide semiconductor layer;
      a first insulating layer over the first oxide semiconductor layer; and
      a first gate electrode over the first oxide semiconductor layer with the first insulating layer interposed therebetween; and
   a second transistor comprising:
      a second oxide semiconductor layer;
      the first insulating layer over the second oxide semiconductor layer; and
      a second gate electrode over the second oxide semiconductor layer with the first insulating layer interposed therebetween,
   wherein the first oxide semiconductor layer and the second oxide semiconductor layer each comprise a plurality of crystals of an oxide semiconductor in channel regions,
   wherein c-axes of the plurality of crystals of the oxide semiconductor are aligned to each other in the channel regions, and
   wherein an oxygen concentration in the first oxide semiconductor layer is higher than that in the second oxide semiconductor layer.

2. The semiconductor device according to claim 1, wherein a threshold voltage of the first transistor is lower than that of the second transistor.

3. The semiconductor device according to claim 1,
   wherein the first oxide semiconductor layer comprises:
      a first region overlapping with the first gate electrode; and
      a pair of second regions, wherein the first region is sandwiched between the pair of second regions, wherein the second oxide semiconductor layer comprises:
a third region overlapping with the second gate electrode; and
a pair of fourth regions, wherein the third region is sandwiched between the pair of fourth regions,
wherein the pair of second regions and the pair of fourth regions each comprise dopant, and
wherein the dopant is at least one selected from the group consisting of boron, nitrogen, phosphorus, arsenic, helium, neon, argon, krypton, xenon, and fluorine.

4. The semiconductor device according to claim 3, wherein a concentration of the dopant is higher than or equal to $5\times10^{18}$ atoms/cm$^3$ and lower than or equal to $1\times10^{22}$ atoms/cm$^3$.

5. The semiconductor device according to claim 1, further comprising:
a first source electrode and a first drain electrode between the first oxide semiconductor layer and the first insulating layer; and
a second source electrode and a second drain electrode between the second oxide semiconductor layer and the first insulating layer.

6. The semiconductor device according to claim 5,
wherein the first oxide semiconductor layer comprises:
a first region overlapping with the first gate electrode;
a pair of second regions overlapping with neither the first source electrode nor the first drain electrode, wherein the first region is sandwiched between the pair of second regions; and
a pair of third regions overlapping with the first source electrode or the first drain electrode, wherein the first region and the pair of second regions are sandwiched between the pair of third regions,
wherein the second oxide semiconductor layer comprises:
a fourth region overlapping with the second gate electrode;
a pair of fifth regions overlapping with neither the second source electrode nor the second drain electrode, wherein the fourth region is sandwiched between the pair of fifth regions; and
a pair of sixth regions overlapping with the second source electrode or the second drain electrode, wherein the fourth region and the pair of fifth regions are sandwiched between the pair of sixth regions,
wherein the pair of second regions, the pair of third regions, the pair of fifth regions, and the pair of sixth regions each comprise dopant, and
wherein the dopant is at least one selected from the group consisting of boron, nitrogen, phosphorus, arsenic, helium, neon, argon, krypton, xenon, and fluorine.

7. The semiconductor device according to claim 6, wherein a concentration of the dopant is higher than or equal to $5\times10^{18}$ atoms/cm$^3$ and lower than or equal to $1\times10^{22}$ atoms/cm$^3$.

8. The semiconductor device according to claim 1, wherein the first oxide semiconductor layer and the second oxide semiconductor layer each comprise indium and zinc.

9. The semiconductor device according to claim 3,
wherein the first gate electrode covers the first region of the first oxide semiconductor layer, and
wherein the second gate electrode covers the third region of the second oxide semiconductor layer.

10. A semiconductor device comprising:
a first transistor comprising:
a first gate electrode;
a first oxide semiconductor layer overlapping with the first gate electrode with a first insulating layer interposed therebetween; and
a second transistor comprising:
a second gate electrode; and
a second oxide semiconductor layer overlapping with the second gate electrode with the first insulating layer interposed therebetween,
wherein the first oxide semiconductor layer and the second oxide semiconductor layer each comprise a plurality of crystals of an oxide semiconductor in channel regions,
wherein c-axes of the plurality of crystals of the oxide semiconductor are aligned to each other in the channel regions, and
wherein an oxygen concentration in the first oxide semiconductor layer is higher than that in the second oxide semiconductor layer.

11. The semiconductor device according to claim 10, further comprising:
a first source electrode and a first drain electrode between the first oxide semiconductor layer and the first insulating layer; and
a second source electrode and a second drain electrode between the second oxide semiconductor layer and the first insulating layer.

12. The semiconductor device according to claim 10, wherein the first oxide semiconductor layer and the second oxide semiconductor layer each comprise indium and zinc.

13. The semiconductor device according to claim 10,
wherein the second transistor comprises a plurality of gate electrodes.

14. The semiconductor device according to claim 10,
wherein the first oxide seminconductor layer is over the first gate electrode, and
wherein the second oxide semiconductor layer is over the second gate electrode.

* * * * *

UNITED STATES PATENT AND TRADEMARK OFFICE
CERTIFICATE OF CORRECTION

PATENT NO.        : 8,643,008 B2
APPLICATION NO.   : 13/547119
DATED             : February 4, 2014
INVENTOR(S)       : Shunpei Yamazaki et al.

It is certified that error appears in the above-identified patent and that said Letters Patent is hereby corrected as shown below:

In the Specification:

At column 7, line 56, "a includes" should be --$\alpha$ includes--;

In the Claims:

In claim 13, at column 44, line 44, "plurity" should be --plurality--;

In claim 14, at column 44, line 47, "seminconductor" should be --semiconductor--.

Signed and Sealed this
Twenty-fourth Day of June, 2014

Michelle K. Lee
*Deputy Director of the United States Patent and Trademark Office*